(12) United States Patent
Imanishi

(10) Patent No.: US 6,828,042 B2
(45) Date of Patent: Dec. 7, 2004

(54) ORGANIC ELECTROLUMINESCENCE DEVICE AND PHOTOELECTRON DEVICE USING SAID ELECTROLUMINESCENCE DEVICE

(75) Inventor: Yasuo Imanishi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 161 days.

(21) Appl. No.: 09/791,835

(22) Filed: Feb. 26, 2001

(65) Prior Publication Data

US 2002/0061418 A1 May 23, 2002

(30) Foreign Application Priority Data

Sep. 29, 2000 (JP) ........................................ 2000-302817

(51) Int. Cl.$^7$ .............................................. H05B 33/12
(52) U.S. Cl. ...................... 428/690; 428/917; 428/212; 313/504; 313/506; 313/112; 313/113; 257/98
(58) Field of Search ................................ 428/690, 917, 428/212; 313/504, 506, 112, 113, 116; 257/98

(56) References Cited

U.S. PATENT DOCUMENTS

| | | | |
|---|---|---|---|
| 5,748,271 A | * | 5/1998 | Hikmet et al. ................. 349/69 |
| 5,891,554 A | * | 4/1999 | Hosokawa et al. .......... 428/212 |
| 5,932,965 A | * | 8/1999 | Berggren et al. ............ 313/506 |
| 6,040,069 A | * | 3/2000 | Lupo et al. .................. 428/690 |

FOREIGN PATENT DOCUMENTS

| | | |
|---|---|---|
| JP | 4-40413 | 2/1992 |
| JP | 11102783 | 4/1999 |
| JP | 11-102783 | 4/1999 |

OTHER PUBLICATIONS

C. W. Tang & S. A. VanSlyke, Appl. Phys. Lett. 51, 913 (Sep. 1987).

Yuji Hamada, Chapter 2: Present States and Problems of Organic Electroluminescent Materials, in Remaining Important Problems and Strategy for Practical Use of Organic LED Devices, Organic Electronics Materials Association (ed.), Bunshin Publisher, p. 25–38 (1999), no month.

Tetsuo Tsutsui, Chapter 1: Explanation and Limitation of the Efficiency of Organic Electroluminescence, in Remaining Important Problems and Strategy for Practical Use of Organic LED Devices, Organic Electronics Material Association (ed.), Bunshin Publisher, p. 105–118 (1999), no month.

N. C. Greenham, R. H. Friend, D. D. C. Bradley, Adv. Mater. 6, 491 (1994), no month.

M. A. Baldo, S. Lamansky, P. E. Burrows, M. E. Thompson, S. R. Forrest, Appl. Phys. Lett. 75, 4–6 (Jul. 1999).

M. Hamaguchi & K. Yoshino, Appl. Phys. Lett. 67(23), 3381 (Dec. 1995).

S. Tokito, Y. Taga, T. Tsutsui, Synthetic Metals 91, 49 (1997), no month.

* cited by examiner

Primary Examiner—Marie Yamnitzky
(74) Attorney, Agent, or Firm—Antonelli, Terry, Stout & Kraus, LLP

(57) ABSTRACT

According to the conventional technique, light discharge efficiency was improved by orientation in the direction vertical to the device plane. However, a big reflection loss was caused by increased anisotropy in the refractive index of the light emitting layer, and the discharge efficiency could not be improved as expected. Further, characteristics related to the angle of field were deteriorated by excessive directivity. To avoid problem, the molecular orientation is adjusted according to a design guideline to ensure that the transition dipole moment of the light emitting material used has the optimum direction, and an intermediate layer is provided to adjust the refractive index and to obtain the optimum directivity.

12 Claims, 15 Drawing Sheets

RELATIVE ABSORBANCE

RELATIVE ABSORBANCE

RELATIVE ABSORBANCE

ORGANIC ELECTROLUMINESCENCE DEVICE AND PHOTOELECTRON DEVICE USING SAID ELECTROLUMINESCENCE DEVICE

BACKGROUND OF THE INVENTION

The present invention relates to a new organic electroluminescence device; a thin-film, light-weight and high definition organic electroluminescence device; new photoelectron devices using said devices, such as a thin-film flat panel display, small sized portable projection display, cellular phone display device, portable PC display, real-time electronic bulletin board, light emitting diode, laser, two-dimensional optical pattern generating device, optical computer, optical cross connector and optical router; as well as to the systems and services using them.

There has been a growing demand for a light-weight, high definition and less costly small-sized flat panel display for use in the various types of cellular phones, mobile terminals, mobile computers and car navigation systems being developed. For household and office use, a space saving desktop display, a flat panel display and wall-mounted TV sets are taking the place of conventional CRT tube displays. Especially, digital signal transmission on the order of hundreds to several gigabits/sec. has been put into commercial use in both wired and wireless methods, as a result of the increased use of the high-speed Internet and the progress of digital broadcasting. Time is shifting into an age where general users will exchange a huge amount of information on a real-time basis. Under these circumstances, flat panel displays are required to provide a higher speed display to permit digital processing, in addition to being still more light-weight, and having a higher definition, a higher luminance and a lower price.

The Liquid Crystal Display (LCD), Plasma Display (PD) and Field Emission Display (FED) are currently under study to meet these requirements. In addition to these flat panel displays, new types of flat panel display, referred to as Organic Electroluminescence Devices (OELD) or Organic Light Emitted Diodes (OLED), have begun to draw attention in recent years.

The organic electroluminescence device provides a method of causing fluorescent or phosphorescent organic molecules to emit light by allowing an electric current to flow to the organic compound sandwiched between a cathode and an anode, thereby displaying information. According to the References ("Major Issues of Organic LED Elements to be Solved and Practical Statistics" edited by the Organic Electronics Material Research Organization, Bunshin Publishing Co., mid-1999, P.1–11, and "Preface to Current Situation and Issues of Materials and Devices" by Yoshiharu SATO), organic electroluminescence devices have long been studied mainly with respect to semiconducting crystals, such asanthracene and perylene.

In 1987, Tang et. al. proposed a two-layered organic electroluminescence device laminated with a light emitting organic compound thin film and a hole transporting organic compound thin film (C. W. Tang and S. A. Van Slyke, Appl. Phys. Lett. 51, 913 in 1987). The starting point is that a dramatic improvement of light emitting characteristics is enabled (light emitting efficiency: 1.51 m/W, drive voltage; 10V and luminance: 1000 cd/m$^2$). Since then, a pigment doping technique and high molecular OLED, low working function electrode, mask vacuum evaporation system, etc. have been studied.

In 1997, an organic electroluminescence device based on an electrical charge injection method, called a simple matrix system was partly put into commercial use. Further, a new organic electroluminescence device based on the electrical charge injection method, called an active matrix system is currently under study for development. Such an organic electroluminescence device is operated according to the following principle: A fluorescent or phosphorescent organic light emitting material is made into a thin film between a pair of electrodes, and electrons and holes are injected from positive and negative electrodes. In the organic light emitting material, the injected electron becomes an organic one-electron molecule (simply called an electron) entering the Lowest Unoccupied Molecular Orbital (LUMO) of a light emitting molecule. The injected hole becomes an organic one-hole molecule (simply called hole) entering the Highest Occupied Molecular Orbital (HOMO) of the light emitting molecule. In the organic material, they move toward the opposite electrode. In the middle of the movement, when an electron meets a hole, a singlet or triplet state of excitation of the light emitting molecule is formed. As it deactivates while radiating light, light is released.

Generally, many of the organic light emitting materials are those having a high quantum efficiency with respect to photoexcitation, as in the case of various laser pigments. If these materials are made to emit light by electrical charge injection, the electron and hole have a lower electrical charge transport performance since many organic compounds are insulators. A high voltage on the order of hundreds of volts was required in the initial organic electroluminescence device. However, using excellent electrical charge transporting performances of the organic electrophotographic photoconductor used as a photoconductor of a copying machine, a thin film is divided into two types according to function. One is the film used to transport an electrical charge (hole), and the other is the film used to emit light. This separation of functions of the thin films has improved the light emitting characteristics in the above-mentioned Tang's two-layered organic electroluminescence device.

Recently, a 3-layered organic electroluninescence device has been reported wherein the electron transport performance of another electrical charge is assigned to a third organic thin film. In addition, separated function type and multi-layered film type organic electroluminescence devices have been proposed, wherein thin films assigned to perform various functions are added; for example, an electrical charge injection layer is provided to improve the characteristics of injecting the hole and electron into the organic material and a hole stop layer to improve the probability of re-combination between the two. However, the basis for light emitting is light radiation in the process of deactivation in the state of excitation from the organic light emitting molecule contained in the organic light emitting layer. This basis remains unchanged.

According to the References ("Major Issues of Organic LED Elements to be Solved and Practical Statistics" edited by the Organic Electronics Material Research Organization, Bunshin Publishing Co., mid-1999, P.25–38, and Yuuji HAMADA, "Chapter 2. Current situation and issues of Light Emitting Material"), a great number of the fluorescent or phosphorescent organic light emitting materials are known to have been developed for a variety of purposes, such as ink, dye and scintillator materials. The organic electroluminescence devices are made of these organic light emitting materials. They can be broadly classified in terms of molecular weight into low molecular and high molecular types.

The low molecular type is formed into thin films according to a dry process, such as a vacuum evaporation method, while the high molecular type is formed into thin films according to the cast method. Failure in the formation of organic thin films is said to be one of the reasons why a highly efficient device could not be obtained as an organic electroluminescence device in earlier days before Tang. Conditions required especially for the low molecule type are as follows: (1) Production of a thin film (100 nm level) in the vacuum evaporation system, (2) maintainability of a uniform thin film structure after formation of the film (without segregation crystal), (3) fluorescent light quantum yield in the solid status, (4) appropriate carrier transport performance, (5) heat resistance, (6) easy refining, and (7) electrochemical stability, etc. Further, this type can be classified into two types according to the light emitting process, that is, the light emitting material where light is emitted by direct re-combination between electron and hole, and fluorescent material (or dopant material) where light is emitted by photoexcitation caused by the light emitting material. In addition, when viewed from the differences in chemical structure, the following materials are known; metallic complex type light emitting material (8-quinolinol, benzooxazol, azomethine, flavone, etc. as ligand, and Al, Be, Zn, Ga, Eu, Pt, etc. as central metal) and fluorescent pigment based light emitting material (oxadiazole, pyrazoline, distyryl arylene, cyclopentadiene, tetraphenyl butadiene, bisstyryl anthoracene, perylene, phenanthrene, oligothiophene, pyrazoloquinoline, thiadiazopyridine, laminated perovskite, p-sexiphenyl, spiro compound, etc.).

As described above, a great variety of materials and techniques have been studied on the light emitting material and device production process of the organic electroluminescence device. However, these studies have not yet completely clarified the efficiency where the amount of light can be emitted from such an organic electroluminescence device. According to the References ("Major Issues of Organic LED Elements to be Solved and Practical Statistics" edited by the Organic Electronics Material Research Organization, Bunshin Publishing Co., mid-1999, P.105–118, and "Chapter 1 Interpretation and Limit of Light Emitting Efficiency" by Tetsuo IZUTSU), optical energy taken out of the organic electroluminescence device is given in terms of the number of photons released for each of electrons or holes running through the device. If this is expressed in terms of external quantum efficiency of electroluminescence $\eta_\phi(ext)$, the following relationship is known to hold:

$$\eta_\phi(ext)=\eta_{ext}\times\eta_\phi(int)=\eta_{ext}\times[\gamma\times\eta_r\times\eta_f] \quad (1)$$

where $\eta_\phi(int)$ is an internal quantum efficiency representing the number of photons released for each of the electrons or holes running through the device inside the device, and $\eta_\phi(ent)$ denotes the efficiency of discharging, out of the device, the light produced inside the device after having been reduced by reflection or absorption on the device boundary. $\gamma$ shows the charge balance equivalent to the ratio of the numbers of the electrons and holes injected inside the device, and $\eta_r$ indicates the singlet exciton generation efficiency denoting the ratio of emitting the i-term exciton contributing to light emitted from the injected electric charge. $\eta_f$ denotes light emitting quantum efficiency representing the ratio of emitting light and deactivating in the singlet exciton.

The external quantum efficiency $\eta_\phi(ext)$ equivalent to the amount of light emitted out of the device can be broadly classified into three, that is, $\eta_r$ and $\eta_f$ determined by the properties of the light emitting material itself, $\gamma$ determined by the ratio of injecting the electrons and holes into the device, and $\eta(ext)$ determined by the device structure. $\eta_r$ and $\eta_f$ are efficiencies related to the physical properties of the light emitting material itself and are uniquely determined by the light emitting material. $\gamma$ is the amount determined by the electrical potential difference between the electrode and organic layer adjacent thereto, the boundary potential and the ease of movement of the electrons and holes in the organic layer. It is an efficiency uniquely determined by the physical properties of the electrode material and device internal organic material. Of these factors, the charge balance $\gamma \leq 1$. The singlet exciton generation efficiency $\eta_r$ is said to be the electrical charge spin $\eta_r \leq 0.25$. Light emitting quantum efficiency $\eta_r < 1$ except in the super-radioactive process. Therefore, the portion of the factor determined by the organic material inside the device and electrode material (the portion $[\gamma\times\eta_r\times\eta_f]$ in Formula (1)) is said to be 0.25 or less. On the other hand, according to the Reference (Greenham, R. H. Friend, D. D. C. Bradley. Adv. Mater. 6, 491 in 1994), the discharge efficiency is determined by the reflection and refraction of classical optics. Assuming that the refractive index of the light emitting layer is "n", it is given by the following equation:

$$\eta_{ext}=1/(2n^2) \quad (2)$$

The refractive index of the light emitting layer of many organic electroluminescence devices or the glass substrate holding them is about 1.6. Thus, $\eta_{ext}=0.2$. From the above discussion, the external quantum efficiency of the external electroluminescence is $\eta_\phi(ext) \leq 0.2\times0.25=0.05$, and the external quantum efficiency is said to be 5% at most.

To put the organic electroluminescence device to commercial use, it is essential to improve the external quantum efficiency. The external quantum efficiency of the above-mentioned conventional organic electroluminescence device has an upper limit, so the development of an organic electroluminescence device having different functions is currently under way. One of the methods is to improve the light emitting quantum efficiency singlet exciton generation efficiency $\eta_r$ of the light emitting material itself. In the conventional charge injection and re-combination process, singlet exciton occurs at the ratio of 0.25, and triplet exciton occurs at the ratio of 0.75. By contrast, the triplet exciton is converted to a singlet exciton by spinning in a reverse direction through an inter-item intersection resulting from the spin/orbital angular moment interaction of the organic light emitting material containing heavy metal, or the triplet exciton that has occurred is converted into a singlet exciton through mutual collision of triplet excitons enclosed in the nano-level range, thereby increasing the ratio of the exciton making contribution to light emission. As the material having such a new exciton generation mechanism, an organic electroluminescence device capable of high-efficiency light emission through the use of fac tris(2-phenylpyridine)iridium [Ir(ppy)3] is introduced in Reference (M. A. Baldo, S. Lamansky, P. E. Burrows, M. E. Thompson, and S. R. Forrest, Appl. Phys. Lett. 75, 4–6 in 1999).

Another method is intended to improve the external quantum efficiency outside the device by improving the discharge efficiency $\eta_{ext}$. Namely, a uniform thin film structure without crystal segregation has been considered essential for the production of the organic electroluminescence device. In this case, the organic light emitting material constituting the light emitting layer is random-oriented in terms of space. So light has been emitted isotrophically in all directions inside the device. By contrast, a means of controlling the light emitted in the direction parallel to the light emitting surface of the device and increasing the light emitted in the vertical direction is described in the Reference (Japanese Patent Laid-Open 40413/1992) which discloses an organic electroluminescence device having a light emitting layer comprising molecules uniaxially oriented, for example, by the rubbing method.

According to the Reference (Japanese Patent Laid-Open No. 102783-1999), in the organic electroluminescence device produced by forming a light emitting layer in the dry process in a vacuum and by orienting the organic molecules constituting the light emitting layer parallel to the light emitted surface by photoisomerization reaction, an anisotropic light emitting characteristic was similarly obtained inside the light emitting layer. However, improvement of the discharge efficiency by orientation is not specifically described in these References. Only the Reference (Japanese Patent Laid-Open NO. 102783/1999) describes that light emitting efficiency outside the device was improved about 1.6 times from 0.51 m/W to 0.8 m/W.

In the earlier Reference (M. Hamaguchi and K. Yoshino, Jpn, J. Appl. Phys. Vol. 34, P. L712, in 1995), detailed measurements were made on the light emitting anisotropy and discharge efficiency of the oriented organic electroluminescence device. According to FIG. 1 thereof, a remarkable difference in the amount of light to be discharged is observed in the direction parallel to the orientation and the direction vertical thereto. By contrast, no marked difference in the amount of the discharged light is observed between the oriented sample and non-oriented sample.

As described above, methods of improving the light emitting efficiency over the previous level are being studied for the organic electroluminescence device. Since many such factors are included, no definite guideline has been established as yet.

To put such an organic electroluminescence device into practical use, it is essential to improve the external quantum efficiency. There is an upper limit to the external quantum efficiency of the above-mentioned conventional organic electroluminescence device. One of the methods is to improve the singlet exciton generation efficiency $\eta_r$ of the light emitting quantum efficiency of the light emitting material itself, and to improve the external quantum efficiency outside the device by improving the discharge efficiency $\eta_{ext}$. Of these, the latter proposal is associated with the improvement of discharge efficiency $\eta_{ext}$. It is intended to provide a more extensive efficiency improvement.

Namely, when the discharge efficiency of the conventional organic electroluminescence device was analyzed, isotrophic light emission inside the light emitting layer was the basis for logical analysis. Improvement of discharge efficiency was suggested when molecules were oriented uniaxially or in parallel to the light discharge plane. But there was no clear description of the specific degree of orientation, its orientation or the correlation between the related direction of light emission and the structural orientation direction of the molecules. Therefore, the relationship between the molecule orientation direction and orientation direction to provide the optimum discharge efficiency was not necessarily clear. For this reason, it was not possible to perform absolute quantitative design regarding the obtained spatial orientation for light emission.

Furthermore, systematic and concrete study has not been made to clarify the relationship among the polarization and double refraction of the light emitting component itself caused by forming the state of anisotropic light emission, changes in the ease of movement of related electrons and holes, and the state of the boundary between the device and the outside of the device to discharge their light emitting characteristics out of the device in the final phase. In addition, no study has been made on the relationship with various intermediate layers existing between the light emitting layer and device boundary. The impact of these factors upon the emission spectrum distribution has not been studied. For this reason, no sufficient achievement has been made in terms of improvement of the external quantum efficiency based on the discharge efficiency improvement technique of conventional devices.

A control method by a fine resonator having a resonance length on the order of a wavelength is known as a orientation control means for an emission pattern. For example, the Reference (S. Tokito, Y. Taga and T. Tsutsui, Synthetic Metals, Vol 91, P. 49, 1997) includes a report on a fine resonator structure type organic electroluminescence device where tris(8-quinolinolato) aluminum (Alq3) is used as a light emitting material, and MgAg is employed for the electrode cum reflector on the back side, ITO for the electrode on the light discharge side, and ($SiO_2/TiO_2$) derivative multi-layered film for the translucent mirror on the light discharge side. FIGS. 3 and 4 show that the directivity of the emission pattern is improved by the introduction of a fine resonator structure. When the light intensity is "1" on the front of the light emitting device, the radiation angle where the light intensity is reduced to a half is about 60° when there is no fine resonance structure. By contrast, the light intensity is reduced to about 20° when a fine resonance structure is used, according to this Reference. However, in this method, the directivity of radiation differs according to the light wavelength, and there is a big change in the spectrum depending on the angle of view. At the same time, the directivity is increased extremely. So when it is used as a display for an organic electroluminescence device, there has been a problem that the angle of the field is reduced.

Another method is disclosed in the Reference (Japanese Patent Laid-Open NO.102783/1999). According to this method, a light emitting layer is formed in vacuum by a dry process, and the organic compound molecule constituting said light emitting layer is oriented in parallel to the light emitting surface, thereby improving the light emitting efficiency. According to this report, the light emitting organic molecule is oriented randomly in three dimensions in the conventional light emitting layer, and a light emitting efficiency of about 0.2 was the limit. According to this technique, the light emitting efficiency is excellent in the direction vertical to the light emitting surface. In this case, the light emitting molecule may be randomly oriented in two dimensions within the surface parallel to the light emitting surface, according to said Reference. In this technique, however, when the light intensity on the front of the light emitting device is "1", radiation angle where the light intensity is reduced to a half is still about 20°, as shown in FIG. 3, and the directivity is too high. This has been a problem.

Namely, the optimum comprehensive conditions for the device have not been proposed for the overall improvement of the characteristics in an organic electroluminescence device, such as light emitting efficiency, discharge efficiency, directivity and anisotropy.

Furthermore, there has been no proposal on the image display system and configuration method thereof using the effects specified said organic electroluminescence devices which cannot been observed in other flat panel displays, or on the method of use, for example, in video distribution services based on said system which cannot be observed in the conventional video or sound broadcasting services.

SUMMARY OF THE INVENTION

One embodiment of the present invention provides an organic electroluminescence device and photoelectron device using said device, characterized by allowing both positive and negative electrical charges to be injected and transported, allowing light to be emitted by recombination between holes and electrons generated by the positive and negative electrical charges, and comprising a light emitting substance which emits light due to re-combination contained in the organic electroluminescence device or a fluorescent substance capable of emitting a secondary light upon receipt of light from the light emitting substance.

The organic electroluminescence device is characterized in that at least one light emitting substance or fluorescent substance capable of emitting light anisotropically inside the light emitting substance layer is provided, and the majority of the transition dipole moment of the molecular skeleton related to light emission in the molecules constituting the light emitting substance or fluorescent substance is distributed at an angle from 0 to 70 deg. with respect to the direction of the normal to the light discharge plane in the layer to which the substance belongs.

The organic electroluminescence device and photoelectron device using said device is characterized in that light discharged out of the anisotropically-light emitting substance layer has a polarizing characteristic.

The organic electroluminescence device and photoelectron device using said device is characterized in that a first class intermediate layer is contained outside the anisotropically light-emitting substance layer between the layer and the boundary for discharge of light out of the organic electroluminescence device, and the refractive index of the intermediate layer of the first class is lower than that of the anisotropically light-emitting substance layer or refractive index of the fist class intermediate layer and does not exceed 1.42.

The organic electroluminescence device and photoelectron device using said device is characterized in that the thickness of the first class intermediate layer has the length greater than the wavelength of the light discharged.

The organic electroluminescence device and photoelectron device using said device is characterized in that the orientation exhibiting the maximum light intensity in the distribution of the intensity of light discharged out of the anisotropically light-emitting substance layer is located within the range from 0 to 60 deg. with respect to the normal axis of the boundary for discharging light out of the device.

The organic electroluminescence device and photoelectron device using said device is characterized in that light is anisotropically emitted from the fluorescent substance capable of emitting a secondary light upon receipt of light from the light emitting substance.

Another embodiment of the present invention provides an organic electroluminescence device and photoelectron device using said device, characterized by allowing both positive and negative electrical charges to be injected and transported, allowing light to be emitted by re-combination between holes and electrons generated by the positive and negative electrical charges, and comprising a light emitting substance which emits light due to re-combination contained in the organic electroluminescence device or a fluorescent substance capable of emitting a secondary light upon receipt of light from the light emitting substance; wherein the organic electroluminescence device and photoelectron device using said device are further characterized in that a second class intermediate layer is contained outside the light-emitting substance layer between the layer and the boundary for discharge of light out of the organic electroluminescence device, and distribution of the intensity of light discharged out of the substance layer is increased after passing through the second class intermediate layer.

The organic electroluminescence device and photoelectron device using said device is characterized in that the second class intermediate layer is capable of scattering light or diffusing the optical path.

Still another embodiment of the present invention provides an organic electroluminescence device and photoelectron device using said device, characterized by allowing both positive and negative electrical charges to be injected and transported, allowing light to be emitted by re-combination between hole and electron generated by the positive and negative electrical charges, and comprising a light emitting substance which emits light due to re-combination contained in the organic electroluminescence device or a fluorescent substance capable of emitting a secondary light upon receipt of light from the light emitting substance; wherein the organic electroluminescence device is characterized in that a third class intermediate layer is located outside the light-emitting substance layer in the direction opposite to the boundary for discharging light out of the organic electroluminescence device, and the light taken out of the substance layer to the third class intermediate layer by the third class intermediate layer is reflected.

The organic electroluminescence device and photoelectron device using said device is characterized in that the light taken out of the substance layer to the third class intermediate layer by the third class intermediate layer is reflected in a direction other than the direction of regular reflection.

A further embodiment of the present invention provides an organic electroluminescence device and photoelectron device using said device, characterized by allowing both positive and negative electrical charges to be injected and transported, allowing light to be emitted by re-combination between hole and electron generated by the positive and negative electrical charges, and comprising a light emitting substance which emits light due to re-combination contained in the organic electroluminescence device or a fluorescent substance capable of emitting a secondary light upon receipt of light from the light emitting substance; wherein the organic electroluminescence device is characterized in that the light emitting substance layer is separated by a partition having a contact surface which is not parallel to the boundary for discharging light out of the organic electroluminescence device, and the partition is formed along the height crossing the light emitting layer or is formed on a layer or substrate other than the light emitting layer.

The organic electroluminescence device and photoelectron device using said device is characterized in that the partition viewed from the discharge boundary is polygonal and at least two sides of the partition forming the polygon are parallel.

The organic electroluminescence device and photoelectron device using said device is characterized in that at least one of a pair of parallel partitions forming the polygon has a length equivalent to one fourth to two fourths of the wavelength of the emitted light.

The organic electroluminescence device and photoelectron device using said device is characterized in that the partition viewed from the discharge boundary is circular.

The organic electroluminescence device and photoelectron device using said device is characterized in that the diameter of the circular partition is equal to length equivalent to one fourth to two fourths of wavelength of the emitted light.

The organic electroluminescence device and photoelectron device using said device is characterized in that the contact surface that is not parallel to the light discharge boundary of the partition can reflect or bend the light taken out of the light emitting substance layer.

The organic electroluminescence device and photoelectron device using said device is characterized in that reflection by the partition is not regular reflection.

The organic electroluminescence device and photoelectron device using said device is characterized in that a pair of the fourth class intermediate layers becoming one or more pairs of resonator mirrors holding the substance layer in-between is contained outside the light emitting substance layer, and the distance between the pair of the fourth class intermediate layers is an integral multiple of a length equivalent to one fourth to two fourths of wavelength of the emitted light.

A still further embodiment of the present invention provides an organic electroluminescence device and photoelectron device using said device capable of allowing both positive and negative electrical charges to be injected and transported, allowing light to be emitted by re-combination between holes and electrons generated by the positive and negative electrical charges, and comprising a light emitting substance which emits light due to re-combination contained in the organic electroluminescence device or a fluorescent substance capable of emitting a secondary light upon receipt of light from the light emitting substance; wherein at least one light emitting substance or fluorescent substance capable of emitting light anisotropically inside the light emitting substance layer is provided, and the majority of transition dipole moment of the molecular skeleton related to light emission in the molecules constituting the light emitting substance or fluorescent substance is distributed at an angle from 0 to 70 deg. with respect to the direction of the normal to the light discharge plane in the layer to which the substance belongs.

The organic electroluminescence device is further characterized in that a second class intermediate layer is contained outside the anisotropically light-emitting substance layer between the layer and the boundary for discharge of light out of the organic electroluminescence device, and the distribution of the intensity of light discharged out of the substance layer is increased after passing through the second class intermediate layer; or a third class intermediate layer is located outside the light emitting substance layer in the direction opposite to the boundary for discharge of light out of the organic electroluminescence device, and the light discharged out of the substance layer to the third class intermediate layer by the third class intermediate layer is reflected; or, the light emitting substance layer is separated by a partition having a contact surface unparallel to the boundary for discharging light out of the organic electroluminescence device, and the partition is formed along the height crossing the light emitting layer or is formed on a layer or substrate other than light emitting layer.

The organic electroluminescence device and photoelectron device using said device is characterized in that the partition is formed in the direction parallel to the direction of polarization having occurred inside the device film surface but not in the direction vertical to the direction of polarization.

The organic electroluminescence device and photoelectron device using said device is characterized in that the direction showing one half of the luminance in the direction of 0 deg. with respect to the direction of the normal to the light discharge plane is 40 deg. or more.

The organic electroluminescence device and photoelectron device using said device is characterized in that the light emitting substance layer contains an organic compound of ionic nature.

The organic electroluminescence device and photoelectron device using said device is characterized in that an organic compound having the structure of Chemical Formula 1 contained therein.

[Chemical Formula 1]

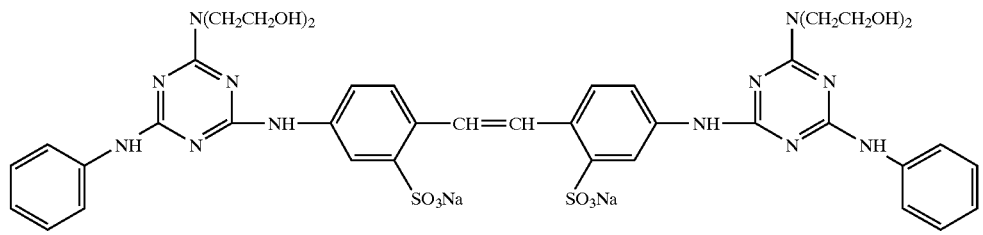

The organic electroluminescence device and photoelectron device using said device is characterized in that light is taken out of the boundary opposite to the substrate with respect to the light emitting substance layer.

The organic electroluminescence device and photoelectron device using said device is characterized in that the organic electroluminescence device is formed on the substrate where an amorphous silicon thin film transistor or polycrystalline silicon thin film transistor is formed, or on the substance where an organic thin film transistor is formed.

The organic electroluminescence device and photoelectron device using said device is characterized in that the organic electroluminescence device is integrated after having been formed separately from the substrate where an amorphous silicon thin film transistor or polycrystalline silicon thin film transistor or a substrate where the organic thin film transistor is formed.

A still further embodiment of the present invention provides an organic electroluminescence device and photoelectron device using the device characterized by a three dimensional display, which can be viewed by the user wearing glasses which allow the light emitted from the organic electroluminescence device to reach each of the right and left eyes of the user separately in conformity to the difference in polarization, and a three-dimensional display viewing system wherein three-dimensional video information is filmed to provide the three-dimensional display, and image processing is performed, whenever required, so that the information is converted into recording or broadcasting media which are sent to the user.

A still further embodiment of the present invention provides an organic electroluminescence device and photoelectron device using the device characterized by a three dimensional display which can be viewed by the user wearing glasses which allow the light emitted from the organic electroluminescence device to reach each of the right and left eyes of the user separately in conformity to the difference of polarization, and an encryption display viewing system wherein signals are divided to ensure that the normal image is viewed by the user without said glasses, but different information is displayed for the user wearing said glasses due to a difference in polarization.

A still further embodiment of the present invention provides an organic electroluminescence device and photoelectron device using the device characterized by a display viewing system wherein normal display viewing, three-dimensional display viewing and encryption display viewing can be separated on one display screen.

A still further embodiment of the present invention provides an organic electroluminescence device and photoelectron device using the device characterized by a display viewing system; wherein normal display viewing, three-dimensional display viewing and encryption display viewing can be selectively used according to an agreement between the image provider and the user, and the function of the decoder to permit reading by the user can be switched in conformity with said selection, or the decoder selection and time period can be changed according to the agreement as required even if the recording or broadcasting media supplied by the image provider are the same. Furthermore, the agreement can be signed up, modified or canceled by controlling the setup conditions of said display viewing system of the user through the Internet whenever required.

The organic electrolurninescence device allows the holes to be injected from the anode electrode and the electrons to be injected from the cathode electrode for the light emitting layer, including the organic light emitting molecules, and permits light to be emitted by recombination of the holes and electrons inside said light emitting layer, where the layer can be either single or multiple layer. In addition to the organic light emitting molecule which emits light by recombination of a hole and electron, said light emitting layer can contain a fluorescent substance (or phosphorescent substance) which absorbs the light emitted from said organic light emitting molecule to emit another beam of light. Furthermore, said light emitting layer can contain a hole transport substance or electron transport substance which facilitates movement of the hole or electron inside said light emitting layer. Said light emitting layer can also incorporate a capturing substance or electron capturing substance which captures the hole or electron at a specific spatial position or reduces the transportability. Furthermore, said organic light emitting molecule, fluorescent substance (or phosphorescent substance), hole transport substance, electron transport substance, hole capturing substance and electron capturing substance can be incorporated in one and the same layer, or can be dispersed and contained in different layers. Even when these constituting substances are separated, multiple layers containing them are formed, and such multiple layers are collectively called a light emitting layer in the description of the present invention.

A hole injection layer or electron injection layer to improve the hole or electron injection efficiency may be installed between said light emitting layer of the present invention and said anode or said cathode to inject holes or electrons to said light emitting layer.

Substrates to hold said light emitting layer, anode, cathode, hole injection layer and electron injection layer may be installed. Other intermediate layers may be installed whenever required. Such intermediate layers include a reflection mirror to modulate light reflection characteristics, a partial transmission mirror, a filter to allow specific light to pass through, a light switch to adjust the ongoing light timing, a wavelength plate to adjust light phase characteristics, a dispersion plate to disperse light in the ongoing direction, and a protective film to prevent device constituting substances from being deteriorated by external light, heat, oxygen or water. These intermediate layers can be installed between said light emitting layer, anode, cathode, hole injection layer, electron injection layer and substrate or on their outside, as required, based on the specifications which protect device characteristics against deterioration. Of these layers, the layer as the top surface from which light is discharged out of the organic electroluminescence device will be called a top discharge layer.

The transition dipole moment in the description of the present invention denotes the transition moment as a non-diagonal element out of the transition dipole matrix elements constituting the electric dipole transition by molecular light. Its absolute value is proportional to oscillator intensity, and defines the directions of light radiation and polarization. To put it more specifically (according to "Unabridged Dictionary of Applied Physics" edited by the Japan Society of Applied Physics, Ohm Publishing Co., Ltd., 1998), the term electric dipole denotes a pair of electrical charges having different symbols located a certain distance away from each other. By contrast, the transition dipole matrix element appears when calculating the transition probability between quantum states accompanied by dipole radiation. It denotes the matrix element of the initial state $\Psi_i$ and final state $\Psi_f$ of the dipole moment as an operator.

$P_{fi} = <\Psi f|_p|\Psi i>$

Transition between the electron states having different initial and final states (i.e. $\Psi i \neq \Psi f$) is called the transition moment. Assume in this case that the electron mass is $m_o$, the frequency of transition energy between electron states is $\omega_{fi}$, and the value obtained by dividing the black Planck's constant by $2\pi$ is $\eta$. Then the oscillator intensity is expressed by the following formula:

$$Ffi = \frac{2}{m_o \eta \omega_{fi}} |<\varphi_f|p|\varphi_i>2$$

The electroluminescence material which can be used in accordance with the present invention includes various metal complex type light emitting materials (8-quinolinol, benzooxazol, azomethine, flavone, etc. as ligand, and Al, Be, Zn, Ga, Eu, Pt, etc. as central metal) and fluorescent pigment based light emitting material (oxadiazole, pyrazoline, distyryl arylene, cyclopentadiene, tetraphenyl butadiene, bisstyryl anthoracene, perylene, phenanthrene, oligothiophene, pyrazoloquinoline, thiadiazopyridine, laminated perovskite, p-sexiphenyl, Spiro compound, etc.). Or, it is also possible to use various types of high molecule materials (polyphenylene vinylene, polyvinyl carbazole, polyfluorene, etc.) as the light emitting material, or to use the non-light emitting high molecular material (polyethylene, polystyrene, polyoxyethylene, polyvinyl alcohol, polymethyl methacrylate, polymethyl acrylate, polyisoprene, polyimide, polycarbinate, etc.) as a matrix, thereby blending and copolymerizing various types of light emitting materials or fluorescent materials. It is also possible to use various organic holes or an electron transport material (triphenylamine, etc.) as an intermediary. Furthermore, various types of hole or electron injection layers (e.g. Li, Ca, Mg, Cs, CuPc, etc.) can be used as the intermediary, Materials can be used in conformity to the device configuration as required. The preferred compound among various types of said organic electroluminescence material is organic compound having a transition dipole moment with a great light emitting power in the molecular structure capable of anisotropic light emission. It is preferred that a molecular structure which facilitates control of the orientation state of the part of the molecule or molecular skeleton is present in the molecule skeleton itself having the transition dipole moment related to such light emission or in the part of the molecule other than said molecular skeleton.

An organic electroluminescence device according to the present invention can be created using various thin film formation techniques, such as a spin coating method, coating method, casting method, sputtering method, vacuum evaporation method, molecule beam vacuum evaporation method, liquid phase epitaxial method, atomic layer epitaxial method, roll method, screen printing method, ink jetting method, field polymerization method, rubbing method, spraying method, water surface development method and Langmuir-Blodgett film method.

The following methods can be used to control orientation of the transition dipole moment related to said light emission with a desired orientation. There is a spin coating method based on the centrifugal force during film formation, an axial spin coating method to turn the substrate about its rotary axis, a specific direction spraying or high-speed substrate movement/rotation method, a pull-put method, an injection method, a roll orientation method where simultaneous orientation is carried out in the possible film forming process by orientation of the molecular skeleton including a specified transition dipole moment in a specific direction in the film formation process or other molecular skeletons under greater orientation restrictions, a spin coating method after formation of thin film, a rubbing method, an electric field application method, a magnetic field application method, an optical orientation method and a thermal annealing method where orientation is carried out after film formation.

In order to promote orientation during or after film formation, it is also possible to use a crystalline substrate where the substrate itself has an orientation restricting force, an oriented film coated substrate and substrates provided with physical or chemical surface treatment. Furthermore, the molecular skeleton in the compound suited to orientation treatment is preferred to exhibit liquid crystal properties in the orientation process. It is also effective to fix the state of orientation by cooling the sample below the glass transition temperature after orientation or by formation of new chemical bondage between molecules through reaction by light and heat.

Furthermore, the substrate used can also be a substrate comprising such inorganic substances as glass, silicon and gallium arsenide, a substrate comprising such organic substances as polycarbonate, polyethylene, polystyrene, polypropylene and polymethyl methacrylate, or a substrate comprising a combination of organic and inorganic substances. These substrates can be formed by grinding and injection molding after the material is taken out of the matrix. The partition and the second, third or fourth class intermediate layer according to the present invention can be formed inside the substrate or on the surface thereof in the process. After that, the intended organic electroluminescence layer can be formed. In addition, to control the state of light emission, it is possible to use the substrate where a thin film transistor is formed. An organic electroluminescence layer can be formed on the substrate where such a thin film transistor is formed. Or it is also possible to separately produce the substrate where a thin film transistor is formed and the substrate where an organic electroluminescence layer is formed. Then, these substrates can be integrated into one piece.

The organic electroluminescence device of the present invention allows use of various precision processing techniques in order to produce the optical device structure required in the device formation process. Such processing technique includes precision diamond cutting, laser cutting, etching, photolithography, reactive ion etching and focused ion beam etching. It is also possible to lay out multiple pre-processed organic electroluminescence devices, to create multi-layered structures thereof, to connect them by an optical waveguide or seal them in the current state.

The device can be stored in a vessel filled with inert gas or liquid. It can also be provided with a cooling or heating mechanism to adjust the working environment. The vessel can be made of such metals as copper, silver, stainless steel, aluminum, brass, iron and chromium, their alloys, composite materials formed by dispersing such metals in high molecular materials such as polyethylene and polystyrene, and ceramic materials. In addition, a heat insulating layer, foamed styrene, porous ceramic, glass fiber sheet and paper can also be used. Especially, coating can be provided to prevent dew condensation. The inert liquid to be filled inside can be water, heavy water, alcohol, wax of a low melting point, mercury and the liquid mixture thereof. Inert gas to be filled inside can be helium, argon, nitrogen, etc. A desiccator can be placed to reduce humidity in the vessel.

The organic electroluminescence device of the present invention can be treated for improvement of its external appearance, characteristics and service life after formation of the product. Such post-treatment includes thermal annealing, application of radiation, irradiation with an electron beam, light, radio waves, magnetic beam and supersonic waves. Furthermore, the organic electroluminescence device can be made composite in various ways, for example, by adhesion, fusion, electrodeposition, vacuum evaporation, crimping, dyeing, formation of melting, kneading, press molding, coating, and other appropriate means in conformity to particular applications or purposes.

The organic electroluminescence device of the present invention can be packaged with a high density at a position close to the electronic circuit for drive, and can be integrated with the interface or antenna for exchange of signals with the outside.

DESCRIPTION OF THE PREFERRED EMBODIMENTS

A description of various embodiments of the organic electroluminescence device according to the present invention will be described with reference to the drawings and various tables.

(First Embodiment)

First, the light emitting characteristics of the light emitting molecules contained in the organic electroluminescence device as a basic feature of the present invention, or the fluorescent molecules which emit secondary light upon receipt of light from the light emitting molecule, will be described with reference to the design guideline of the device to be obtained.

For the organic electroluminescence device according to the present invention, the following is defined as the most important aspect with respect to the device design. Namely, the organic electroluminescence device allows positive and negative electrical charges to be injected and transported, is capable of emitting light by recombination between the holes and electrons generated by said positive and negative electrical charges, and is capable of containing a light emitting substance which emits light by recombination included in said organic electroluminescence device, or a fluorescent substance capable of emitting secondary light upon receipt of light from the light emitting substance; wherein the light emitting organic electroluminescence device and photoelectron device using said device emit light anisotropically inside said light emitting substance layer, and the transition dipole moment related to emission of said light of at least one light emitting substance or fluorescent substance in the layer to which the substance belongs is distributed in the direction normal to the light discharge plane at angles between 0 and 45 degrees. This will be described below with reference to the following drawings and tables.

Figure 1A:
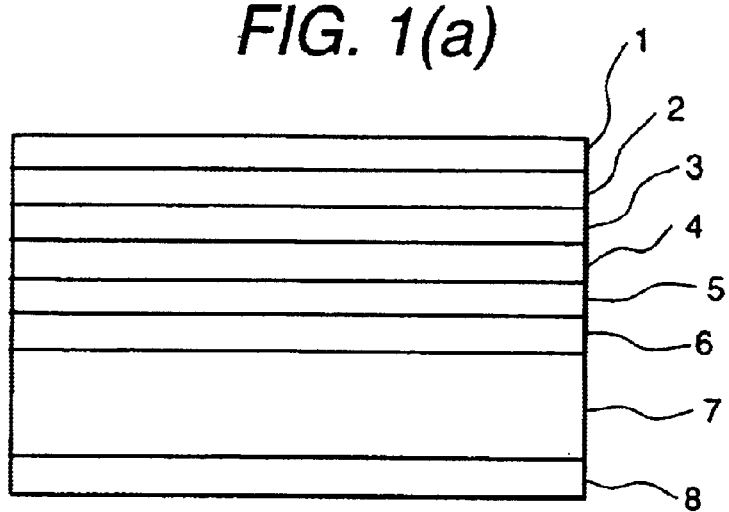
FIGS. 1(a) and 1(b) are diagrams which show examples of the basic structure of an organic electroluminescence device according to the present invention.
Figure 1B:
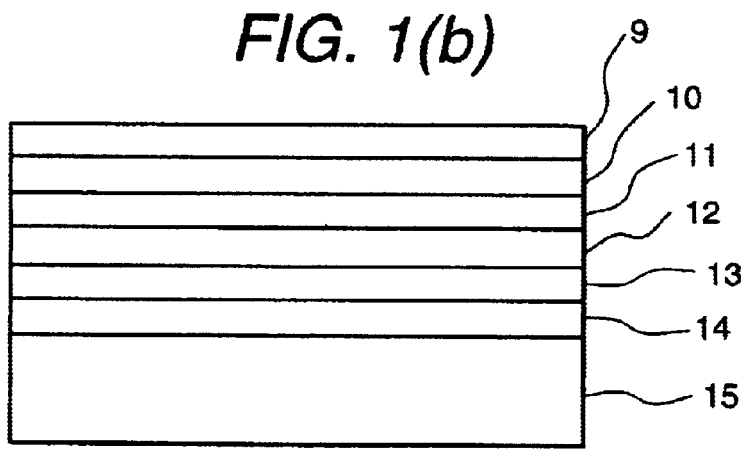

FIGS. 1(a) and 1(b) show the basic structure of the organic electroluminescence device according to the present invention. FIG. 1 shows the device structure where the light coming from the oriented light emitting layer (4) formed on the transparent substrate (7) is directed to the substrate side. More specifically, the transparent anode (6), hole injection layer (5) and oriented light emitting layer (4) are installed on the transparent substrate (7) one on top of another. Further, an electron Injection layer (3), cathode (2) and protective layer (1) are formed on them. A top discharge layer (8) is formed below the transparent substrate (7). The light emitting layer (4) which emits light in response to the ejection of a hole from the anode and an electron from the cathode and their recombination is preferred to have a thickness of 10 nm or more. It forms a thin film layer containing the organic light emitting molecule.

FIG. 1(b) shows a device structure when the light from oriented light emitting layer (12) formed on the substrate (15) without transmission is moved to the side opposite to the substrate. More specifically, cathode (14), electron injection layer (13), oriented light emitting layer (12), hole injection layer (11), transparent anode (10), and top discharge layer (9) are disposed on the substrate (15) in that order.

The light emitting layer (4) which emits light in response to ejection of a hole from the anode and an electron from the cathode and their recombination is preferred to have a thickness of 10 nm or more. It forms a thin film layer containing the organic light emitting molecules. In this case, the top discharge layer (9) performs the function of the protective layer (1), which is omitted. Furthermore, cathode (2) also serves as a reflection mirror.

In FIG. 1(a) and FIG. 1(b), the lamination order of cathode, electron injection layer, light emitting layer, hole injection layer and anode can be reversed. In that case, however, the material must be changed to ensure that the cathode or anode on the side of the top discharge layer is transparent. The material must also be changed to ensure that the anode or cathode on the opposite side performs the functions of a reflection mirror.

Figure 2A:
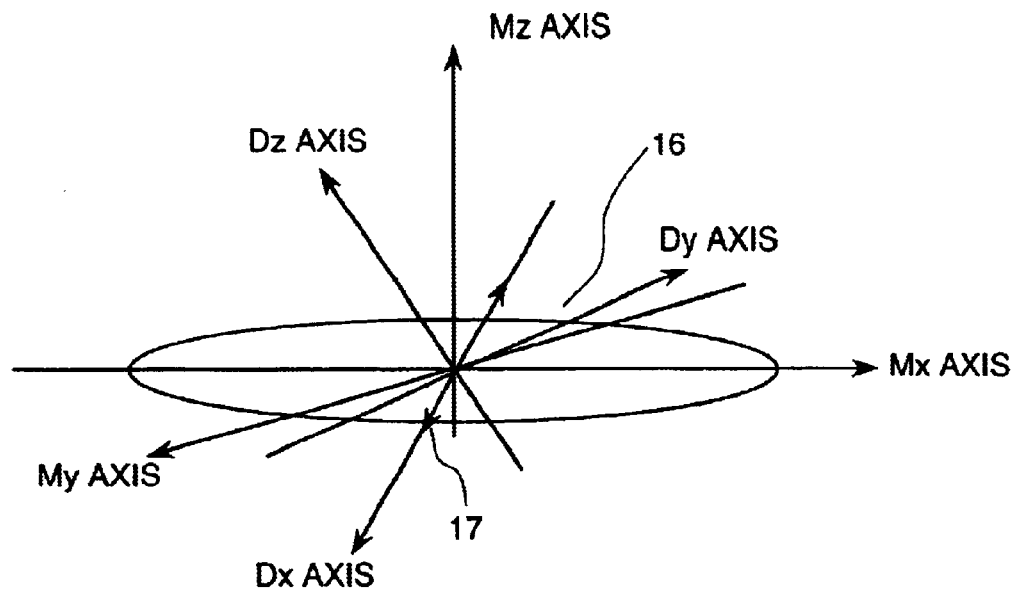
FIGS. 2(a) and 2(b) are diagrams illustrating the coordinate system used to define the spatial relationship between the molecule skeleton axis, the transition dipole moment and the device discharge plane of the light emitting material used in the organic electroluminescence device according to the present invention.
Figure 2B:
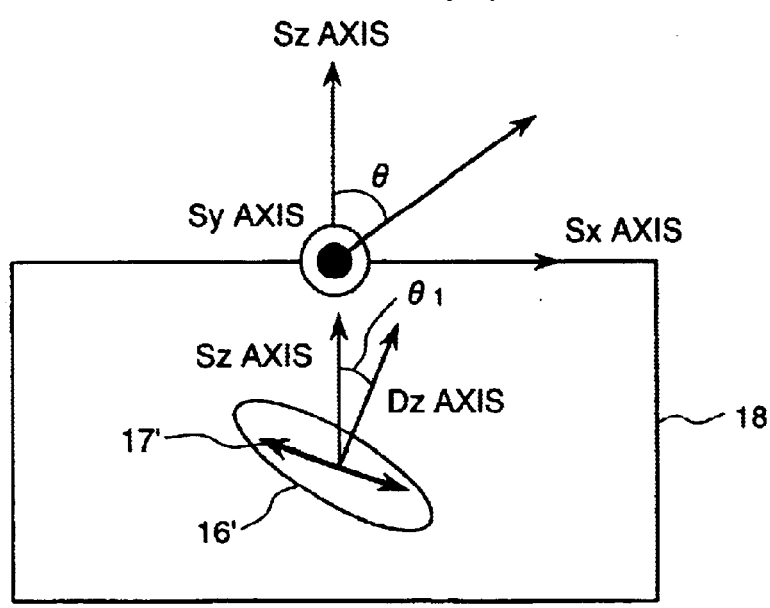

Regarding the basic configuration in the present invention, it is important that the dimensions are designed so that the following relationship holds between the angular relationship between the orientation of the transition dipole moment of said organic light emission molecule related to light emitting and the direction normal to the light discharge plane of said organic electroluminescence device, and the thickness of the related layer. FIG. 2(a) and FIG. 2(b) show the orientational relationship of said organic electroluminescence molecule and light discharge plane for this explanation. FIG. 2(a) shows the orientational relationship between the transition dipole moment (17) of said organic electroluminescence molecule (16) and the molecular axis. FIG. 2(b) defines the angular relationship between said organic light emitting molecule (16') and its transition dipole moment (17'), and the direction normal to the light discharge plane of said organic electroluminescence device (18).

As shown in FIG. 2(a), if the orientational axes of the organic light emitting molecule in structure are Mx, My and Mz, the orientational axis can be defined uniquely by the molecular structure in the light emitting layer, generally. (In this case, the internal rotation of the substituent in the organic thin film, etc.) are ignored. By contrast, the direction of transition dipole moment related to light emission varies according to which light emission level is used. Generally, the state of the optimum molecular orientation of the organic electroluminescence device varies according to which light emission level is used. Therefore, designing the light emitting device requires definition of the direction of this transition dipole moment. Assume that the direction of the transition dipole moment of the light emission in question is Dx along the axis, and the direction vertical to the Dx axis where light is radiated most heavily is along the Dz axis. The remaining axis on the left hand side in the direction vertical to the Dx and Dz axes is the Dy axis. Furthermore, the direction of the major axis of the light emitting molecule is Mx, and the direction of the minor axis of the molecule is My. The remaining axis on the left hand side in the direction vertical to the Mx and My axes is the My axis. For the symmetrical molecule, the major and minor axes may not always be fixed. In such a case, a characteristic symmetrical axis is recommended to be selected as a main axis. In this way, the light emitted from the light emitting molecule and light emission spectrum and direction of radiation can be changed by the selection of the state of excitation in question. This makes it possible to determine the optimum molecular orientation direction corresponding to the selected state of excitation.

The following discussion is directed to the case where one organic light emitting molecule (16') is contained in the organic electroluminescence device (18), as shown in FIG. 2(b). Here the light discharge plane of the organic electroluminescence device (18), is assumed to be the top surface. The direction normal to it is considered the Sz axis, and the direction where the direction of the transition dipole moment (namely, Dx axis) is subjected to orthographic projection inside the light discharge plane is assumed to be the Sx axis. The remaining axis on the left-hand side in the direction vertical to the Sz axis and the Sx axis is assumed to be the Sy axis. Coordinate axes of the molecular structure, transition dipole moment and organic electroluminescence device are determined in this way. For designing of the most efficient device configuration, this is the transition dipole moment where light is emitted first by electroluminescence.

The angle formed by this normal direction Dz axis and the normal direction of the discharge plane of the device Sz axis is $\theta_1$, and the angle formed by the light actually discharged out of the device and the normal line Sz of the discharge plane is $\theta$. The following quantitative description indicates how light is discharged out of the device in the case of such a molecular orientation, and sets forth the optimum direction of orientation.

Light emitted from one transition dipole moment of a single molecule (electronic field) is expressed as a magnetic field polarized in the direction of the transition dipole moment given by the harmonic oscillator of the electron polarization formed in an approximately excited state. According to the Reference (P. Meystre and M. Sargent III, "Element quantum optics", 2nd ed., Springer-Verlag, Berlin, 1991, ISBN3-540-54190-X; Sec. 1–3 Linear Dipole Oscillator), the pointing vector S of the light emitted in this manner (electronic field) is given by the following formula:

$$S = \frac{e^2 v^2 \cos^2 \theta}{16\pi^2 \varepsilon_0 c^3 R^2} n$$

where $\varepsilon_0$ denotes the dielectric constant under vacuum, "C" the light velocity under vacuum, "R" denotes the distance from the center, "e" denotes the charge of an electron, "v" denotes light frequency, "$\theta$" denotes the angle of harmonic frequency from the normal axis, and "n" denotes a unit vector in the direction of radiation. This means that the emission pattern of the harmonic oscillator is proportional to $\cos^2 \theta$. Assuming that the coefficient inherent to a substance is "k", then the light intensity $K(\theta)$ in the direction q is given by:

$$K(\theta) = k \cos^2 \theta.$$

The following shows a prior calculation of the relationship with the total amount of light $F_{total}$ where one molecule inside the light emitting layer is given:

$$F_{total} = 2 \times \int_0^{\frac{\pi}{2}} k\cos^2\theta \times 2\pi\sin\theta d\theta$$

$$= \frac{4\pi k}{3} \int_0^{\frac{\pi}{2}} k\cos^2\theta \sin\theta d\theta = \frac{4\pi k}{3}[-\cos^3\theta]_0^{\frac{\pi}{2}} = \frac{4\pi k}{3}$$

The constant k is erased from the formula, thereby defining the light intensity $K(\theta)$ as:

$$\therefore K(\theta) = \frac{3F_{total}}{4\pi}\cos^2\theta$$

Figure 3:
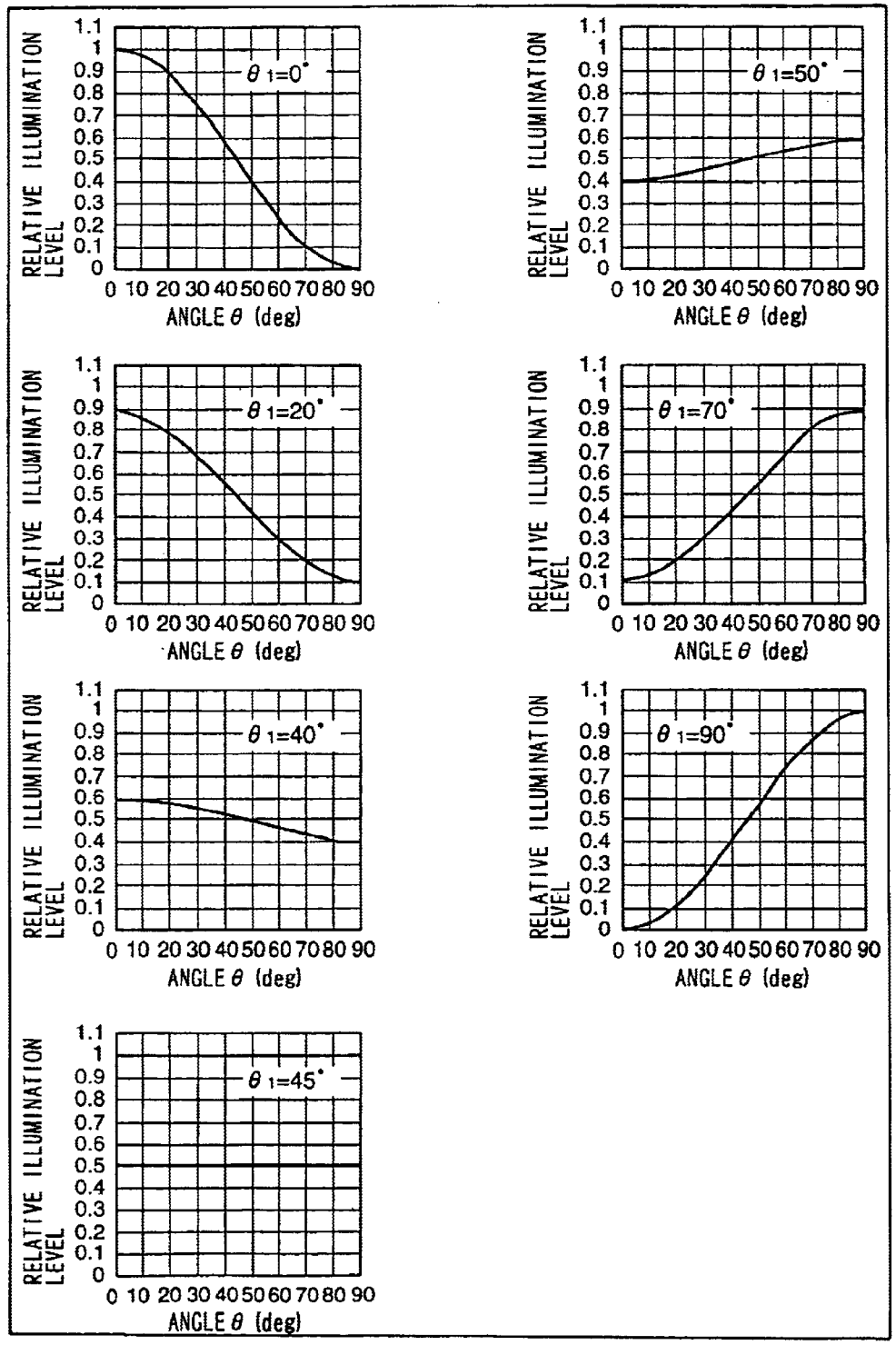
FIG. 3 illustrates a series of graphs which represent the relative amount of ongoing light to the device discharge with respect to a given angle of the transition dipole moment of the light emitting material used in the organic electroluminescence device according to the present invention.

FIG. 3 shows the dependency of the amount of the light emitted from one molecule inside the light emitting layer on the ongoing direction of the light when the total amount of light is standardized. Since the same light is emitted with respect to one transition dipole moment to the objects on the upper and lower positions, only the emission pattern from one side will be described below. FIG. 3 shows the relative amount of light in the direction of angle $\theta$ when the transition dipole moment $\theta_1$ of the molecule is gradually changed from 0 deg. (transition dipole moment parallel to the device discharge plane) to 90 deg. (transition dipole moment vertical to the device discharge plane). The total amount of light (integral value over the entire angle of each graph) is the same in all cases. Actually, the light of the same emission pattern is discharged on the opposite side. The organic electroluminescence device according to the present embodiment has on the opposite side an electrode playing the role of a reflection mirror. So this light is also reflected and is emitted in the same manner. For the sake of simplicity, however, only the emission pattern on one side will be described below).

First, when $\theta_1=0$ deg., the transition dipole moment becomes parallel with the light discharge plane. $\cos^2$ dependency is given such that the value becomes the maximum in the direction of $\theta=0$ deg. and is 0 in the direction of $\theta=90$ deg. Then, the orientation of the light emitting molecule changes. When 0 deg. $<\theta_1<90$ deg. $+\theta$ and $-\theta$ are present in the direction of Dx, so $[\cos^2(+\theta_1+\theta_4)+\cos^2(-\theta_1+\theta)]/2$ dependency is given. The intensity in the direction of $\theta=45$ deg., is reduced and the intensity in the direction of $\theta=90$ deg. is increased. When $\theta=45$ deg., the relative amount of light become the same for all angles of $\theta$. Further, with increase of $\theta 1$, the intensity for $\theta=0$ deg. and the intensity for $\theta=90$ deg. are reversed. When $\theta_1=90$ deg., the value is 0 in the direction of $\theta=0$ deg. and is the maximum in the direction of $\theta=90$ deg. As described above, the emission pattern given by the transition dipole moment of the molecule inside the light emitting layer can be obtained uniquely by the orientation direction $\theta_1$.

Figure 4A:
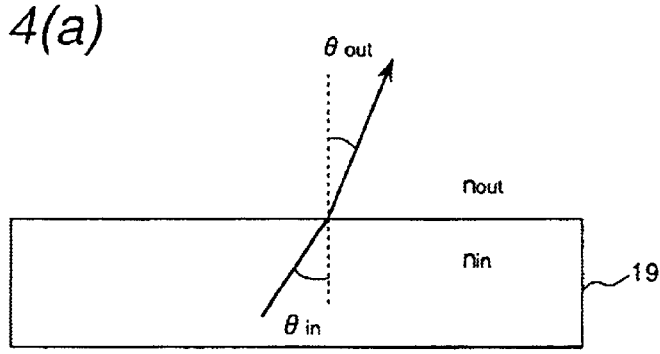
FIG. 4(a) is a diagram and FIG. 4(b) is a series of graphs which show the relationship between optics and the p-polarization transmittance of the discharge angle when light is directly discharged to the outside from one of the light emitting layers of the organic electroluminescence device according to the present invention.
Figure 4B:
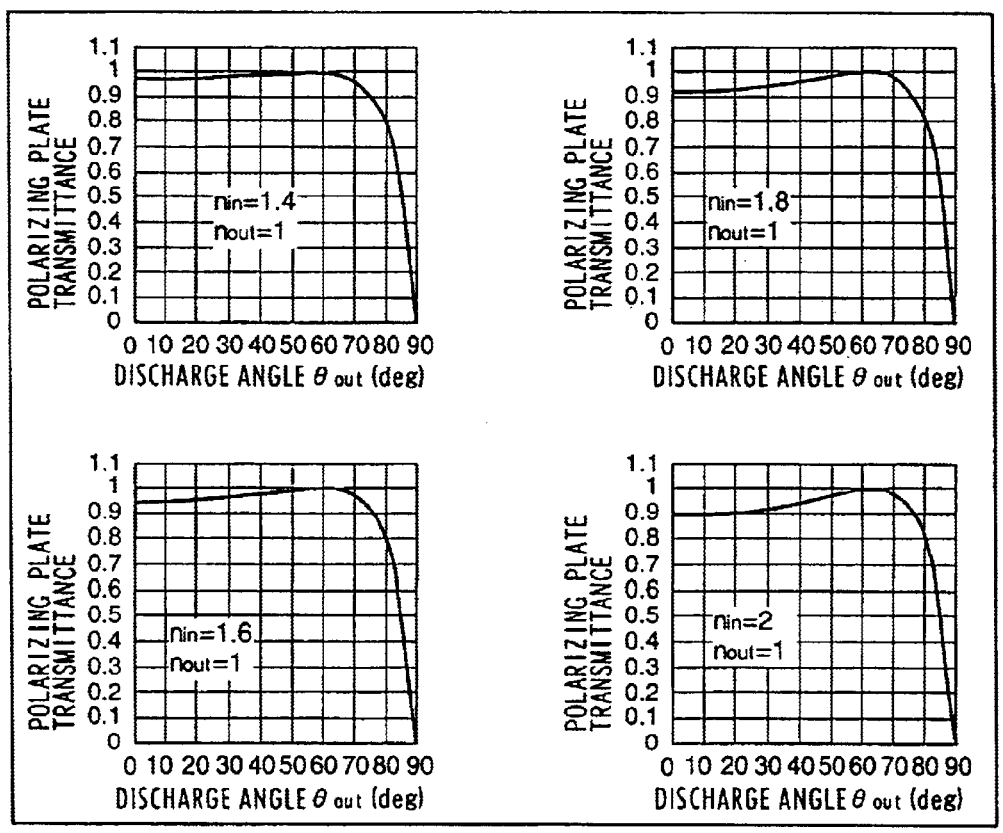

The following description indicates how to obtain the emission pattern when light is discharged out of the light emitting layer from such a light emitting layer. FIG. 4(a) shows the optical path where light entering at an angle $\theta$ in discharged from inside the light emitting layer (19) onto the discharge plane at an angle $\theta$ out. Assuming that the refractive index inside the light emitting layer is "$n_{in}$" and the external refractive index is "$n_{out}$", since light polarized in the direction Dx of the transition dipole moment is emitted, the dependency of the transmittance on the boundary for the p-polarization is obtained. According to the Reference (J. Tsujiuchi "An Introduction to Optics 1", Basic Course of Science and Engineering 11, Asakura Shoten, 1979, II. P. 5 to 32), we get:

$$t_p = \frac{2\frac{n_{in}}{\mu_{in}}\cos\theta_{in}}{\frac{n_{out}}{\mu_{out}}\cos\theta_{in} + \frac{n_{in}}{\mu_{in}}\cos\theta_{out}}$$

$$T_p = \frac{n_{out}\cos\theta_{out}}{n_{in}\cos\theta_{in}}t_p^2$$

where "$t_p$" denotes the amplitude transmission coefficient with respect to p-polarization, "$T_p$" denotes the transmittance with respect to p-polarization, and "$\mu_{out}$" indicates permeability outside the light emitting layer. When a normal dielectric is taken into account, we get $\mu_{in}=\mu_{out}=1$. Using this formula, FIG. 4(b) shows the transmittance when the refractive index inside the light emitting layer is changed, with respect to the refractive index $n_{out}=1$ (air refractive index) outside the light emitting layer.

Figure 5:
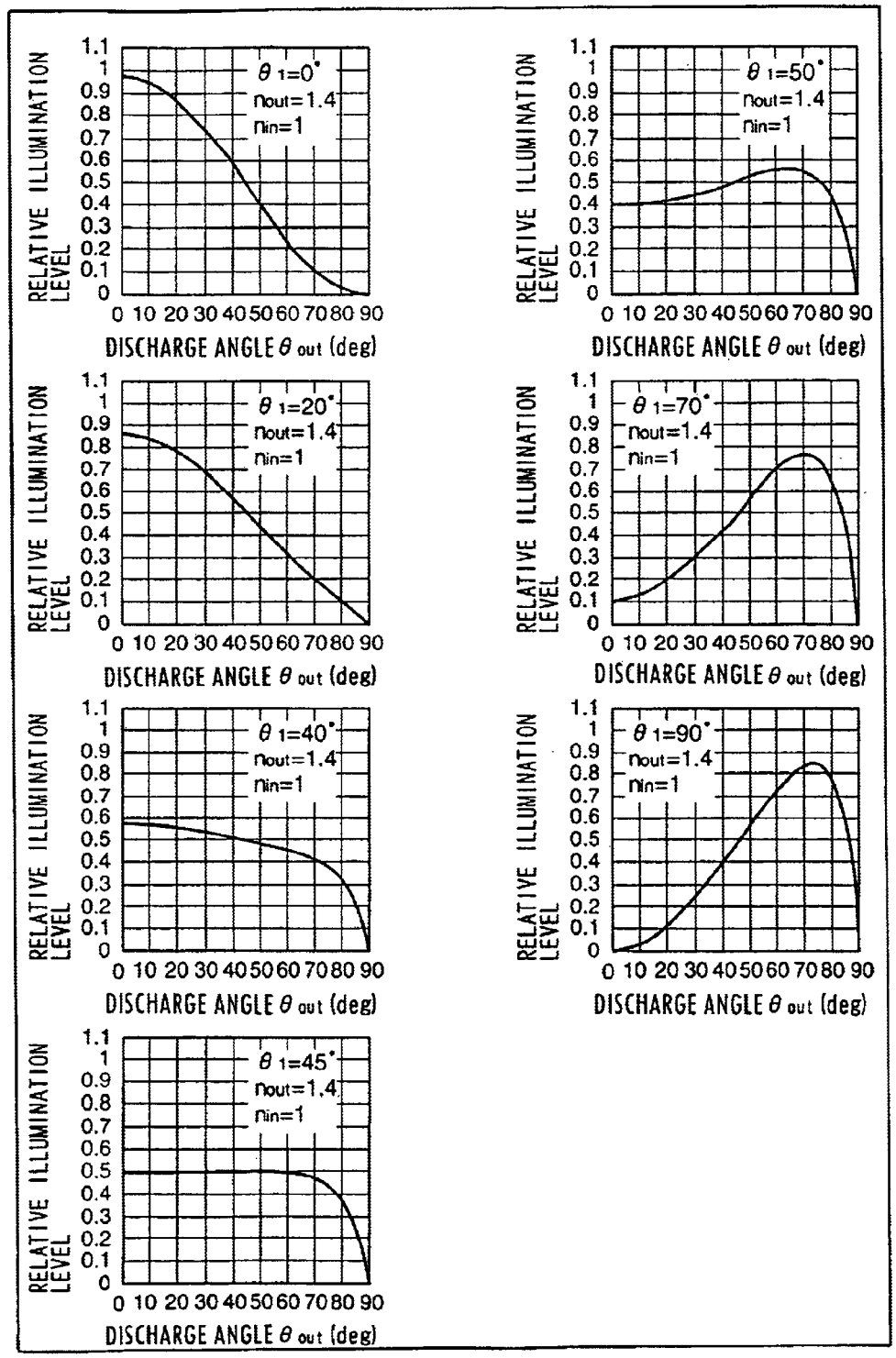
FIG. 5 is a series of graphs which show the relative amount of ongoing light to the device discharge plane with respect to a given angle of the transition dipole moment of the light emitting material used in the organic electroluminescence device according to the present invention when light is directly discharged to the outside from one of the light emitting layers.
Figure 6:
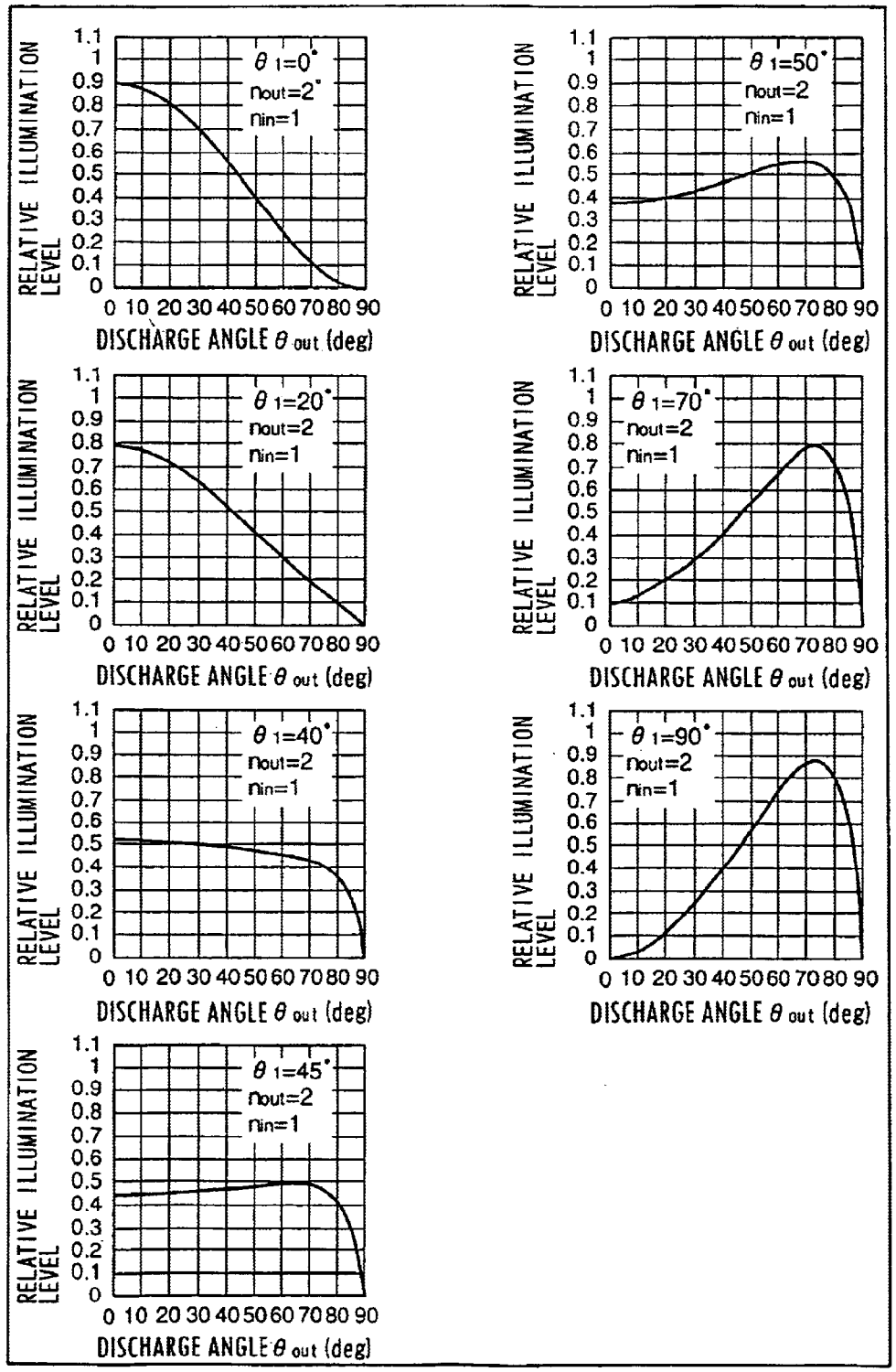
FIG. 6 is a series of graphs which show the relative amount of ongoing light in a manner similar to that of FIG. 5 where the internal refractive index is greater.

When $\theta_{out}>70$ deg., the transmittance is gradually reduced under the influence of the total reflection inside the light emitting layer. In the case of such transmittance characteristics, emission patterns from the specific transition dipole moment of one molecule as shown in FIG. 3 are shown overlapped in FIGS. 5 and 6. If the tilting angle $\theta 1$ is gradually increased from 0 deg., there is a reduction in the intensity at the angle $\theta$ close to 0 deg. in a similar manner. However, the intensity at an angle $\theta$ close to 90 deg. has a small transmittance, so there is no increase. Therefore, in the range from 0 deg. to 45 deg., the maximum amount of discharged light is given by $\theta=0$ deg. at all times.

In the range from 45 deg. to 90 deg. the maximum amount of light is gained at the angle $\theta$ close to 70 deg. FIG. 4(b) shows a case where the refractive index $n_{in}=1.4$ inside the light emitting layer. FIG. 4(b) also shows a case where the refractive index $n_{in}=2.0$ inside the light emitting layer. The discharge angle dependency shows a similar trend in both cases. As the refractive index inside the light emitting layer is higher, the reflective index on the boundary is higher. The transmittance is reduced by that amount.

For example, comparison will be made in the case of $\theta_1=0$ deg. where the light of the highest intensity can be obtained. When $n_{in}=1.4$, the transmittance is 0.97. When $n_{in}=2.0$, the transmittance is 0.90. In many light emitting layers, the refractive index is within the range from 1.6 to 2.0 because of involvement of an organic light emitting molecule and an electrode. There is no direct contact between the light emitting layer and the outside air. Therefore, some intermediate layer present between the light emitting layer and light the discharge boundary cannot be ignored.

Figure 7:
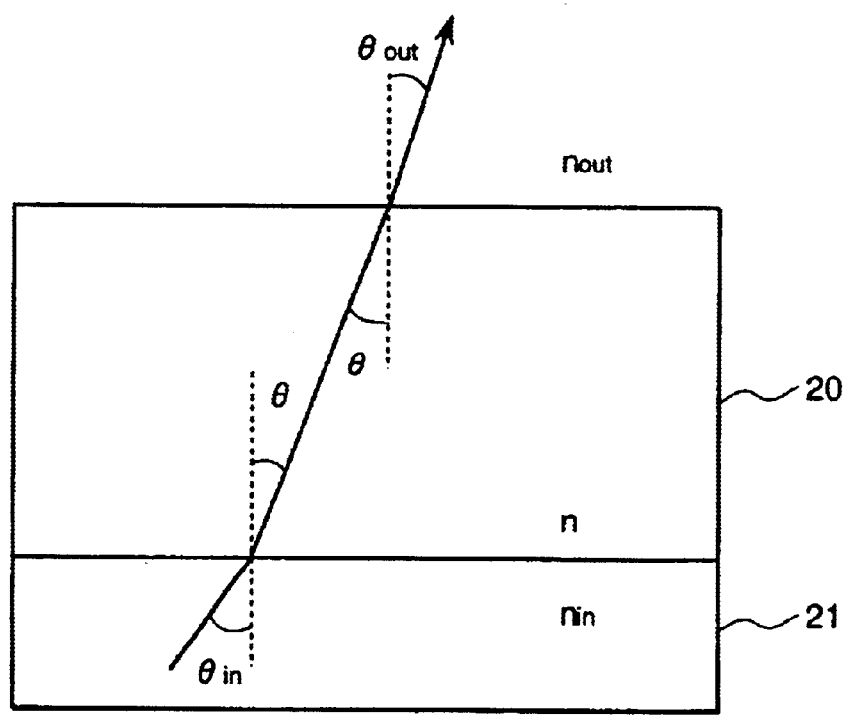
FIG. 7 is a diagram which show an optical relationship when an intermediate layer is provided between the light emitting layer and device exterior.

Thus, as shown in FIG. 7, an intermediate layer (20) is provided between the light emitting layer (21) and light discharge plane, and the refractive index n of the intermediate layer has a value intermediate between $n_{in}$ and $n_{out}$. In this case, the discharge efficiency is obtained. According to the Reference (J. Tsujiuchi "An Introduction to Optics II", Basic Course of Science and Engineering 11, Asakura Shoten, 1979, V, PP. 0 to 56), the transmittance of p-polarization in such a case is given by the following formula:

$$t_p = \frac{2P_{in}}{P_{in}m_{11} + P_{in}P_{out}m_{12} + P_{out}m_{22}}$$

$$T_p = \frac{n_{out}\cos\theta_{out}}{n_{in}\cos\theta_{in}}t_p^2$$

$$P_{in} = \frac{\sqrt{\frac{\varepsilon_0}{\mu_0}}n_{in}}{\cos\theta_{in}}, P_{out} = \frac{\sqrt{\frac{\varepsilon_0}{\mu_0}}n_{out}}{\cos\theta_{out}}, P = \frac{\sqrt{\frac{\varepsilon_0}{\mu_0}}n}{\cos\theta}$$

$$m_{11} = \frac{(1+y)\cos(k\Delta) + i(y-1)\sin(k\Delta)}{2}$$

$$m_{12} = \frac{(1+y)\cos(k\Delta) - i(y+1)\sin(k\Delta)}{2p}$$

$$m_{21} = p\frac{(1+y)\cos(k\Delta) - i(y+1)\sin(k\Delta)}{2}$$

$$m_{22} = \frac{(1+y)\cos(k\Delta) + i(y-1)\sin(k\Delta)}{2}$$

$$k = \frac{2\pi}{\lambda}, \Delta = nd\cos\theta$$

$$y = \exp\left[-\left(\frac{2d/n\cos\theta)}{10\lambda}\right)^2\right]$$

where $\varepsilon_0$ denotes the dielectric constant under vacuum, "$\mu_0$" denotes the permeability under vacuum, "$\lambda$" denotes the wavelength of light, "d" denotes the film thickness of the intermediate layer, "i" denotes a unit of an imaginary number, and "y" denotes a variable representing the degree of coherent distance. This means that an interference effect occurs inside the intermediate layer if the film thickness of the intermediate layer is less than 10 times the distance of about ten times the wavelength.

Figure 8:
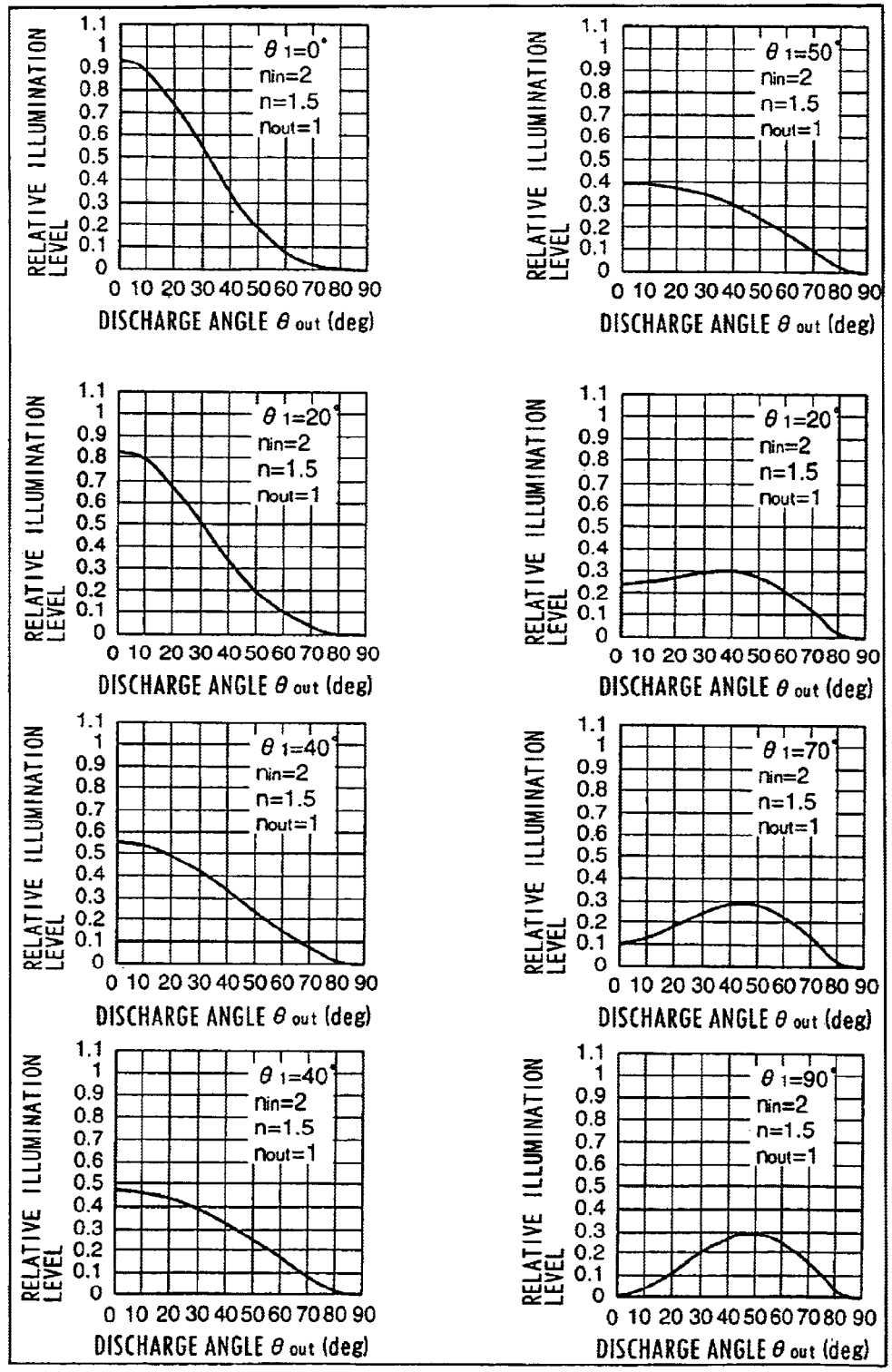
FIG. 8 is a series of graphs which show the relative amount of ongoing light to the device discharge when an intermediate layer is provided between the light emitting layer and device exterior.

Based on this formula, the amount of discharged light is obtained as shown in FIG. 8. In order to prevent interruption within the range from 0.3 to 0.8 micron, the thickness of the intermediate layer was set to 1 mm, and the refractive index of the intermediate layer n was set to 1.5. In this case, when the tilting angle $\theta_1$ is from 0 to 50 deg., the intensity at the angle $\theta$ close to 0 deg. is the maximum at all times. However, the value is decreased gradually as the angle becomes wider. The amount of discharged light itself is also decreased as the tilting angle is increased. It can be seen, however, that, when the tilting angle θ is 70 deg. or more, the shape is changed so that the intensity at the angle θ close to 50 deg. is the maximum. It is clear from the above discussion that the light discharge pattern undergoes a complicated change as the shape of the transition dipole moment changes.

Since the actual light emitting layer contains a great number of molecules, the emission pattern inside the light emitting layer exhibits an average distribution of the molecular population as compared with the case of one molecule. This is schematically shown in FIGS. 9(a) to 9(c).

Figure 9A:
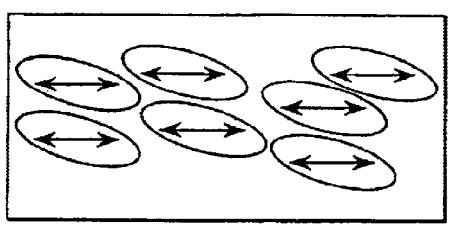
FIGS. 9(a), 9(b) and 9(c) are diagrams which show the relative amount of ongoing light to the device discharge plane with respect to average distribution when there are multiple transition dipole moments of the light emitting material used in the organic electroluminescence device according to the present invention.
Figure 9A:
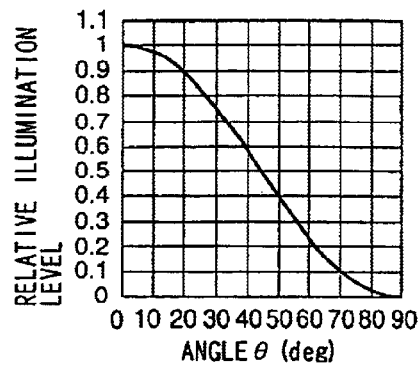
Figure 9B:
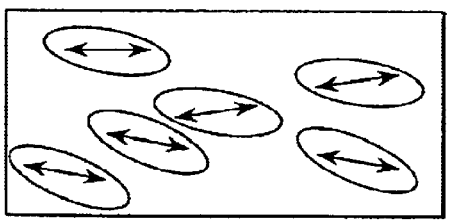
Figure 9B:
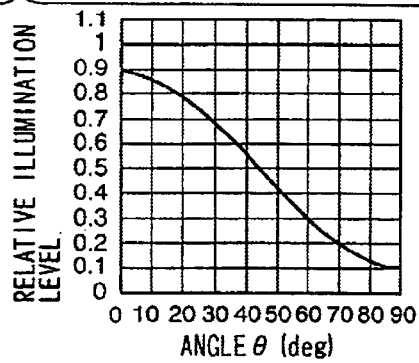
Figure 9C:
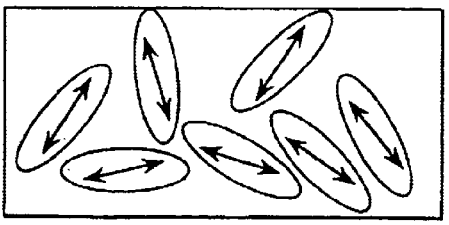
Figure 9C:
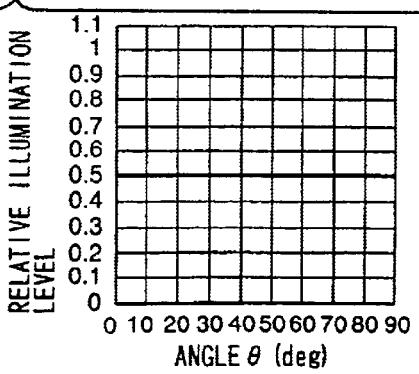

In FIG. 9(a), the transition dipole moments of all the molecules are oriented parallel to the light discharge plane, and the emission pattern is the same as that in the case of one molecule. FIG. 9(b) shows the case where the transition dipole moments of all the molecules are oriented parallel to the light discharge plane, and the orientation is distributed. In this case, the maximum value appears when θ=0 deg., and the intensity is decreased as the angle becomes wider. The slope is more gentle when compared with FIG. 9(a). FIG. 9(c) shows the emission pattern when a complete random orientation is reached as a result of further increase in the distribution of orientation. It reveals that light is emitted at the same intensity in all directions. This emission pattern is the same as in the case of θ1=45 deg. in FIG. 3.

As described above, when orientation of the transition dipole moment is distributed, the emission pattern corresponds to the pattern in either $\theta_1$=0 deg. or 45 deg. discussed with reference to FIG. 3. Therefore, orientation is distributed mainly in another direction, and the emission pattern inside the light emitting layer can be represented by the orientation pattern shown in FIG. 3. Therefore, all orientation patterns in the case of multiple molecules are included in the process of finding the orientation pattern discussed above.

As discussed above, the following two conditions can be given as a guideline for designing an organic electroluminescence device permitting the most efficient light discharge:

1) The transition dipole moment related to electroluminescence should be oriented to a specific position with respect to the optical discharge plane of said organic electroluminescence device, without using the orientation axis in terms of the molecular structure.

2) In the actual organic electroluminescence device where an intermediate layer is provided between the device boundary and light emitting layer, without light being taken directly out of the light emitting layer, at least said transition dipole moment is preferred to be within the range from 0 and over up to 70 deg. exclusive.

The discharge efficiency can be optimized by controlling the orientation of the organic light emitting molecules inside the light emitting layer so that these conditions are met.

(Second Embodiment)

The following description is directed to an example in which a device is formed according to the design guideline for the organic electroluminescence device specifically shown in the First Embodiment.

Firstly, the following discussion considers the result of forming an organic field light emitting device based on the configuration given in FIG. 1(a).

Figure 10A:
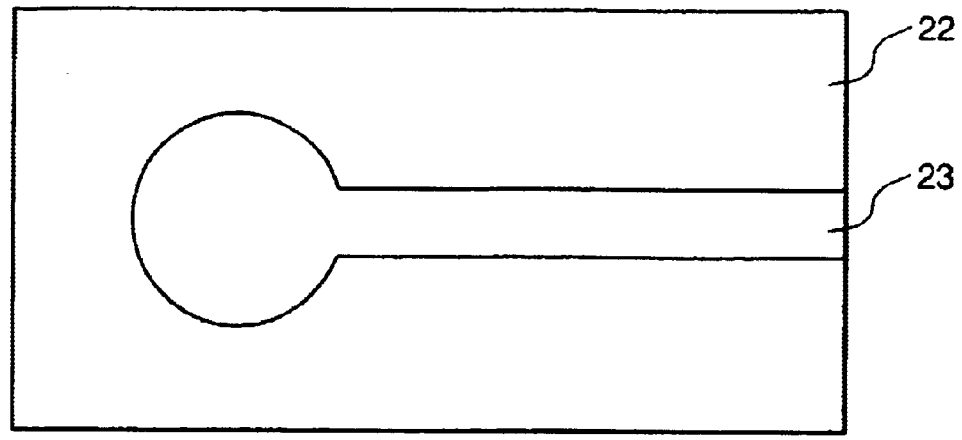
FIGS. 10(a) and 10(b) are diagrams of the electrode pattern of the device used to verify performances of the organic electroluminescence device according to the present invention.
Figure 11A:
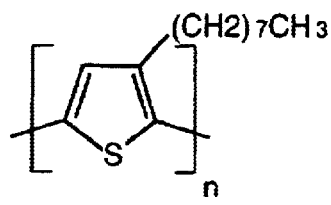
FIGS. 11(a), 11(b), 11(c) and 11(d) are diagrams which represent the structural formula of the compound used to verify the performances of the organic electroluminescence device according to the present invention.
Figure 11B:
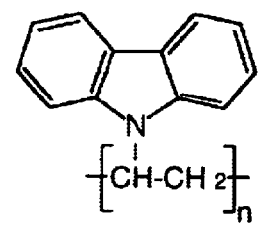

Silicon glass (1 mm thick, with a refractive index of 1.5 1, abbreviated as "Glass") was used as the substrate. Au ITO transparent electrode (ITO=indium tin oxide) was formed into a thin film (150 nm thick) according to the sputtering method using a sputtering system (by Hitachi, DC magnetron in-line type IS-1515). A circular electrode pattern having a diameter of 1 cm at the central portion was formed according to the photo resist method, as shown in FIG. 10(a) (ITO liner resistance: 300 μΩ.cm). Poly(3-octylthiophene) (by Aldrich, with a weight average molecular weight of 142,000, in FIG. 11(a), abbreviated as "PT") was spin-coated on it (to a thickness of 5 nm) as a hole injection layer. It was dried under vacuum after having been air-dried. Spin coating was performed by manual spinner ASS-301 provided by Able Inc. Then, to configure a light emitting layer, polyvinylcarbazole (by Aldrich, with a weight average molecular weight of 1,100,000, shown in FIG. 11(b), abbreviated as "PVC") was spin coated (to a thickness of 50 nm) as a hole transport layer. It was dried under vacuum after having been air-dried.

Figure 11C:
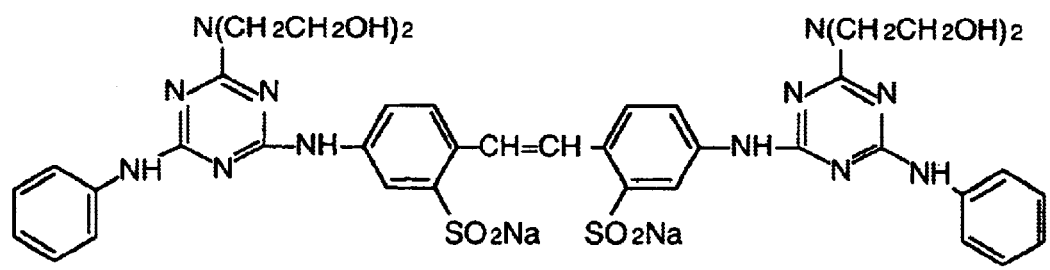
Figure 11D:
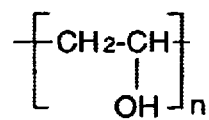

Then, it was spin-coated (to a thickness of 20 nm) with the following solution: 4,4'-bis [{6-[N,N-bis(2-hydroxyethyl) amino]-4-phenylamino-1,3,5-triazin-2-yl)amino]-2,2'-stilbenedisulfonicacid, disodium salt (Fluostine I by Dojinkagaku, FIG. 11(c), abbreviated as FB") was used as a light emitting molecule, and a solution was formed by dispersing 5% in poly(vinylalcohol) aqueous solution (by Wako Junyaku, with an average degree of polymerization of 2,000, a weight percent with respect to water of 1:1, FIG. 11(d), abbreviated as "PVA") as a medium. This solution was used for said spin-coating. After air-drying, it was heated and dried under vacuum. This polyvinylcarbazole layer and poly(vinylalcohol) layer dispersed with light emitting molecules were put together to form the light emitting layer for the embodiment according to the present invention. However, in order to form the light emitting layer with the state of orientation changed, the layout of the substrate on the spin coater was improved.

Figure 12A:
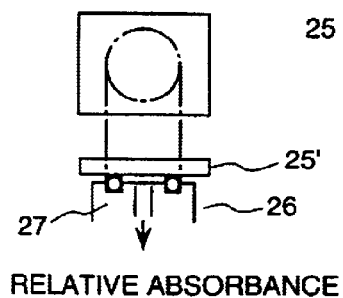
FIGS. 12(a), 12(b) and 12(c) are diagrams which indicate the structure of the spin coater used to verify performances of the organic electroluminescence device according to the present invention.
Figure 12B:
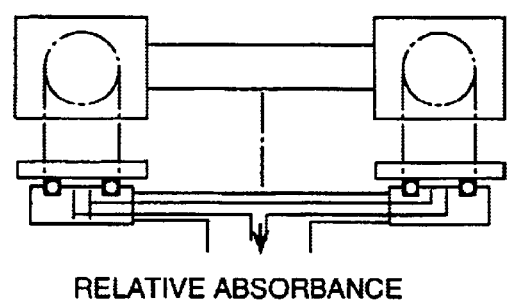
Figure 12C:
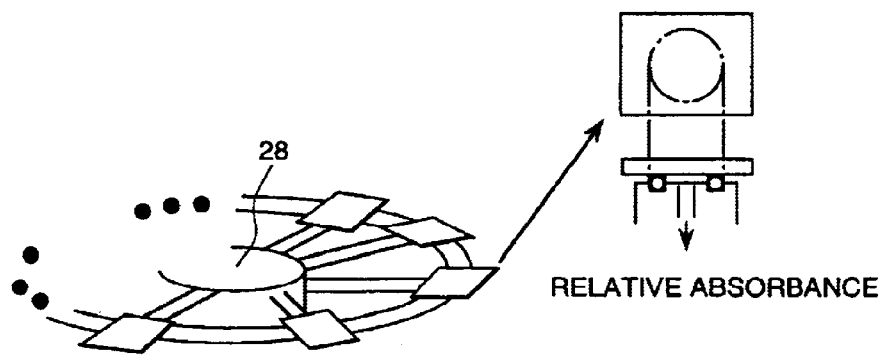

As shown in FIGS. 12(a) to 12(c), the substrate holder with different rotational radius was modified so that the state of random orientation was maintained at the central portion and a greater centrifugal force worked in the centrifugal direction at a position further away from the center. Such improvement was made to change the degree of orientation. Namely, the degree of orientation was adjusted by the position and number of rotations of the substrate on the spin coater.

When the thin film was formed where orientation was not controlled, the holder shown in FIG. 12(a) was used. Where orientation is controlled, the holder shown in FIG. 12(b) was used. In this way, the substrate was fixed in position by vacuum attraction. The holder to create the centrifugal sample is configured so that the substrate is sucked and fixed on the O-ring through the arm some distance away from the center of rotation.

Depending on the system specification, the system is designed to ensure that multiple substrates can be spin-coated in one operation, as shown in FIG. 12(c). In our system, a maximum of two substrates can be mounted. However, the specification of such a centrifugal spin coater is not restricted to the present embodiment of this invention.

Figure 10B:
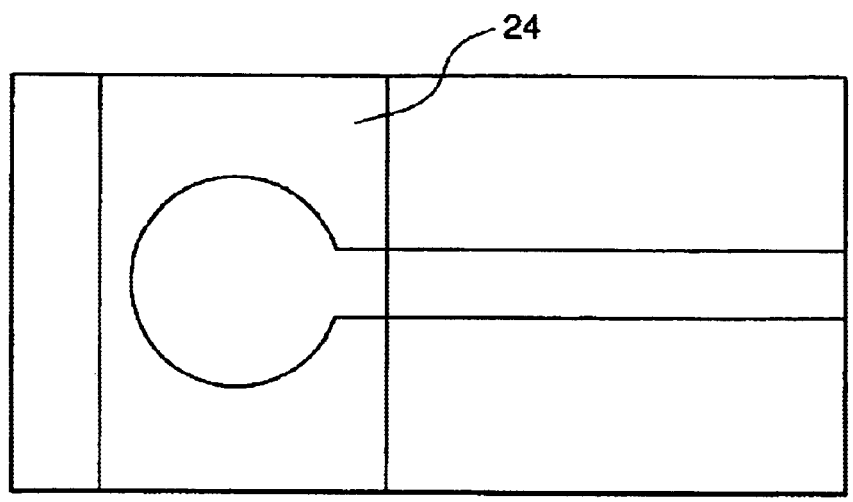

After formation up to the light emitting layer according to said procedures, the spin-coated thin film sample was installed in the vacuum evaporation system (MBE-620-OR by Anerba). Lithium fluoride (LiF by Raremetallix, with a purity of 5N) was subjected to vacuum evaporation (to a film thickness of 2 nm) at the base pressure $1\times10^{-9}$ Torr or less as an electron injection layer. Then, metallic aluminum (Al by Raremetallix, with a purity of 6N) as a cathode was subjected to vacuum evaporation (to a film thickness of 200 nm). When the lithium fluoride and metallic aluminum was subjected to vacuum evaporation, a stainless steel mask (0.5 mm thick) with a window to cover the circular pattern of the ITO electrode as a substrate was kept installed, as shown in FIG. 10(b).

After vacuum evacuation, the sample was taken out of the system, a soldering iron was used to connect an anode wire to the end of the ITO where the cathode was not vacuum evaporated, and the cathode wire was made to contact the end portion of the cathode portion which did not overlap with the ITO pattern through silver paste (5063-AB by Ardeck Inc.). UV resin was used to provide hardening by ultraviolet rays.

After that, the device was sealed by hardening with epoxy resin over the area sufficiently covering the upper and lower portions of the device where a pair of electrons were present. This was used as the protective layer shown in FIG. 11(a). Then, the light discharge area where a thin film of the glass substrate was not formed was cleaned by cloth impregnated with acetone, and fluorine based high molecular Teflon (by duPont, Teflon amorphous fluoropolymer, AF1600s, with a refractive index of 1.32) was cast in it to form a thin film having a film thickness of about 0.1 mm. This was used as the top discharge layer shown in FIG. 1(a). The sample formed according to the above-mentioned procedure will be called a sample Teflon/Glass/ITO/PVC/PT/FB+PVA/LiF/Al.

As a reference sample for the degree of orientation, the reference sample Glass/ITO/PVC/PT/FB+PVA, in which the electron injection layer LiF, cathode Al and top discharge layer Teflon were not formed, was also made according to the procedure for forming the above-mentioned sample Teflon/Glass/ITO/PVC/PT/FB+PVA/LiF/Al. Furthermore, the reference sample Glass/ITO/PVC/PT, in which the FB+PVA layer of the oriented light emitting layer was not formed, was also made according to the same procedure.

To verify the effect of improvement in discharge efficiency, the reference sample Glass/ITO/PVC/PT/FB+PVA/LiF/Al, in which only the last top discharge layer was not formed, was also made according to the same procedure.

The following description is directed to the technique of evaluating the characteristics of the light emitting device of the organic electroluminescence device according to the present invention. Orientation of the transition dipole moment related to light emission was determined according to the following technique.

(1) Degree of In-plane Orientation

Using the reference sample Glass/ITO/PVC/PT/FB+PVA and Glass/ITO/PVC/PT for determining the degree of orientation, the transmission absorbance Abs with respect to straight polarization of vertical incident light was measured for each reference sample. The straight polarization angle $\phi$ in the light discharge plane was changed, and the direction where maximum absorbance Abs was gained was assumed as direction Sx. The direction vertical to Sx in the internal side was assumed as direction Sy. Measurement was made by an absorbance meter (Spectrometer 350 by Hitachi) at a wavelength ranging from 300 to 800 nm at room temperature.

The degree of orientation OP ($\theta$=0 deg.) for the orientation light emitting layer FB+PVA was obtained from absorbance Abs (Sx) of two reference samples in the direction Sx and absorbance Abs (Sy) in the direction Sy according to the following formula:

Abs($\theta$=0°,Sx;FB+PVA)=Abs($\theta$=0°,Sx; Glass|ITO|PVC|PT|FB+PVA)−Abs($\theta$=0°,Sx; Glass|ITO|PVC|PT)

Abs($\theta$=0°,Sy;FB+PVA)=Abs($\theta$=0°,Sy; Glass|ITO|PVC|PT|FB+PVA)−Abs($\theta$=0°,Sy; Glass|ITO|PVC|PT)

$$OP(\theta = 0°) = \frac{Abs(\theta = 0°, Sx; FB + PVA) - Abs(\theta = 0°, Sy; FB + PVA)}{Abs(\theta = 0°, Sx; FB + PVA) + Abs(\theta = 0°, Sy; FB + PVA)}$$

Herein Abs ($\theta$=0 deg.; Sx; Glass/ITO/PVC/PT/FB+PVA) indicates the absorbance of sample Glass/ITO/PVC/PT/FB+PVA with respect to polarization in the direction Sx when incident angle $\theta$=0 deg. This degree of orientation OP ($\theta$=0 deg.) corresponds to the in-plane order parameter. The value is 1 when orientation is given completely in the direction Sx, and is 0 when not oriented. The value ranges from 0 to 1 in the state of intermediate orientation.

Figure 13A:
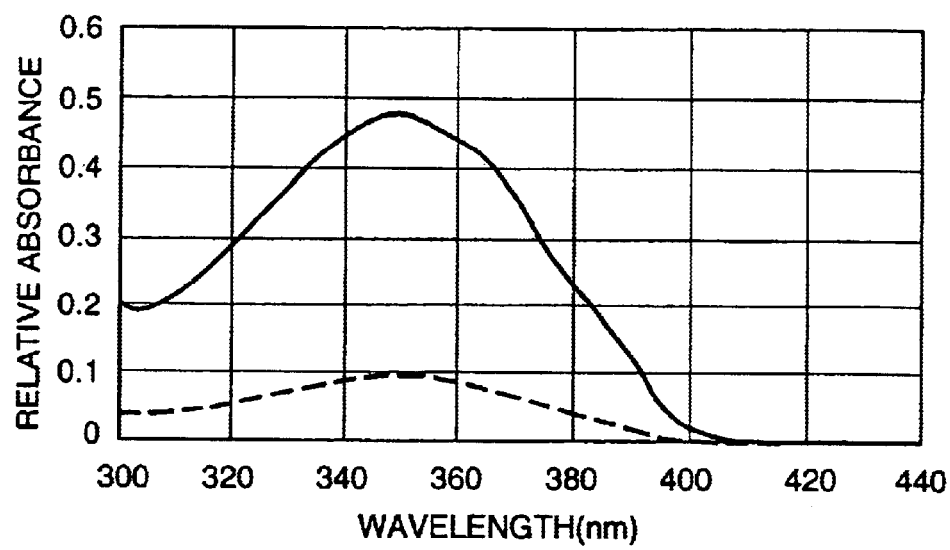
FIGS. 13(a) and 13(b) are graphs of the device absorption spectrum and pattern of the degree of orientation, respectively, created to verify performances of the organic electroluminescence device according to the present invention.

FIG. 13(a) shows the absorption spectrum Abs ($\theta$=0 deg.; Sx; FB+PVA) and Abs (?=0 deg.;S y; FB+PVA) of a typical orientation sample. The absorption spectrum of this orientation light emitting layer has one peak of absorption located close to 350 nm. This corresponds to the state of minimum excitation of the light emitting molecule FB. The spectrum patterns of Abs ($\theta$=0 deg.; Sx; FB+PVA) and Abs ($\theta$=0 deg.; Sy; FB+PVA) were almost the same; only the intensity radio was different. Furthermore, the determined direction Sx agreed with the direction where the centrifugal force of spin coating works.

Figure 13B:
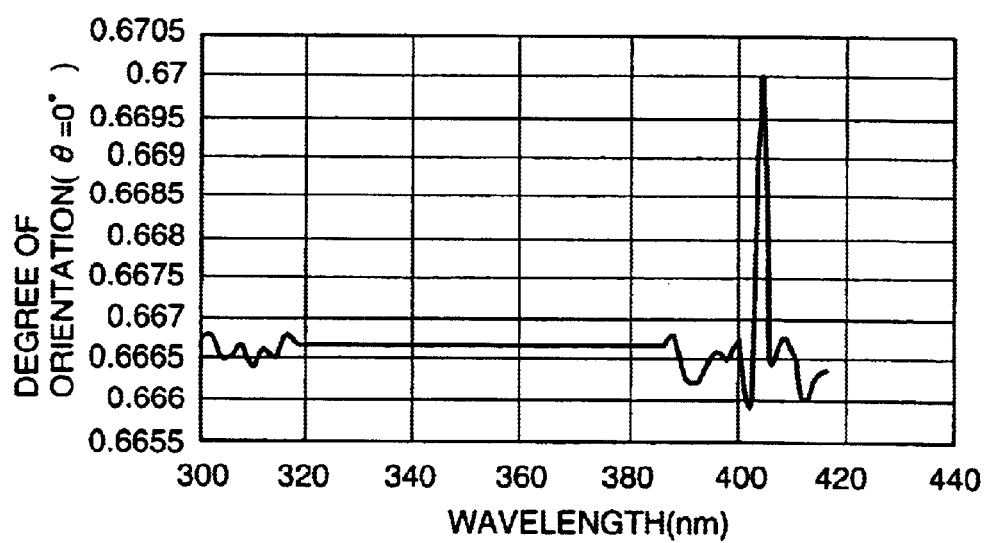

It has been made clear that the molecular skeleton is oriented in that direction. FIG. 13(b) shows the degree of orientation OP($\theta$=0 deg.) gained from the above formula. It can be seen that the degree of orientation of this absorption band is about 0.66664. This means that the orientation of the in-plane light emitting molecule is distributed mainly in the direction Sx.

(2) In-plane Refractive Index

The in-plane refractive index inside of the light emitting layer was determined by the value measured at the wavelength of 633 nm by an Abbe refractometer (by Atago) using a He—Ne laser as a light source, and the dispersion of refractive index obtained by the absorption spectrum obtained in the above-mentioned (1) subjected to Eramers-Eronig transformation. Direction Sx obtained above was used as a main axis.

(3) Out-of-plane Orientation

Figure 14A:
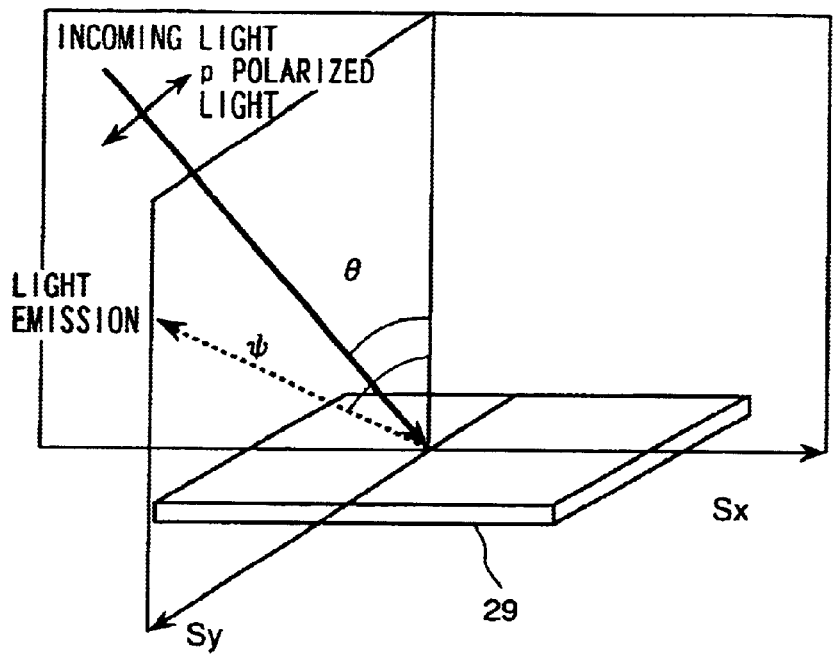
FIGS. 14(a) and 14(b) are a diagram and a graph, respectively, showing the emission pattern of the device created to verify performances of the organic electroluminescence device according to the present invention.

The following method was used to estimate the degree of out-of-plane orientation of the light emitting molecules from the light emitting layer. For the optical system for this evaluation, light emitting distribution for photoexcitation was measured with the layout shown in FIG. 14(a). A laser beam was applied to the orientation sample (29) in the Sx-Sz plane using p-polarization. A measurement was made of the intensity of photoexcitation light emission at the radiation angle $\Psi$ in the Sy-Sz plane with respect to the incident angle $\theta$ at this time. In this case, however, the refractive index of the sample obtained in (2) was used to correct the excitation optical intensity due to the difference transmittance into the orientation sample by the change of incident angle. First, for out-of-plane orientation of the light emitting molecules, the emission intensity after correction was measured when the incident angle $\theta$ was gradually changed in the state fixed at the fixed radiation angle (e.g. $\theta$=30 deg.). In this case, the direction where the emission intensity becomes the greatest is the out-of-plane direction Dx of the transition dipole moment related to the light emission. Further, if there is no $\theta$ dependency, there is no orientation.

To ensure effective photoexcitation close to 350 nm corresponding to the minimum excitation level from the absorption spectrum obtained in (1), photoexcitation was provided by triple wave generating light (at a wavelength of 355 nm) from a Q-switch YAG laser (DCR-3 by Quantaray). To change the incident angle of the excitation light, rotation was given with respect to the laser incoming path where the sample substrate on the goniostate was fixed. At the same time, the sensor of the actinometer was fixed onto the goniostate of another rotary axis to measure the spatial distribution of the light emission spectrum. A spectral radiation illuminometer (Spectro Radiometer USR40V by Ushio Denki) was used as an actinometer to measure the wavelength spectrum and the optical intensity at each wavelength in one operation. A selective wavelength filter to prevent mixture of excitation light and a polarizer to adjust the state of polarization were used as required.

Figure 14B:
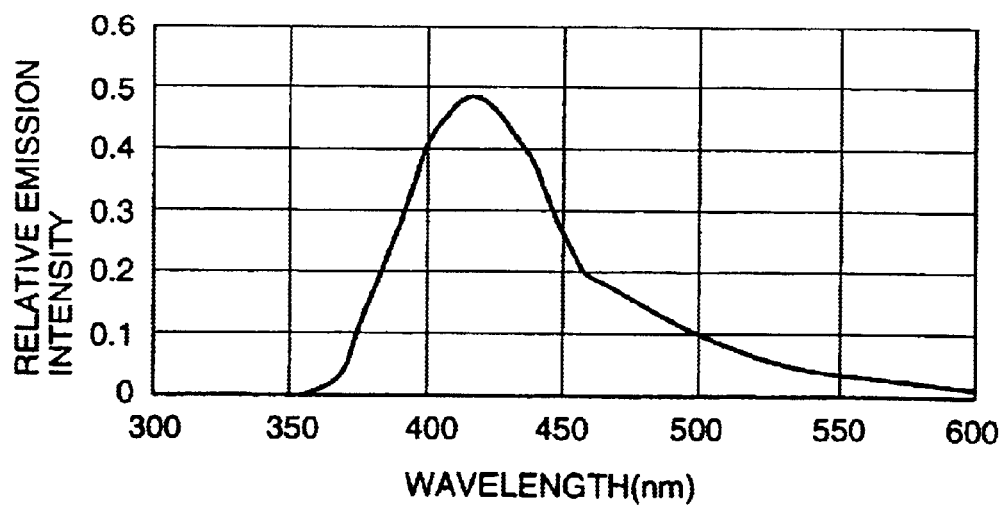

FIG. 14(b) shows an example of the generated fluorescent spectrum. (Fluorescent spectrum generated from the substrate was measured in the same optical system using the reference sample without an orientation layer, and the effect was then corrected. This will not be explained below). Measurement was made by changing the radiation angle. No change was observed in the spectrum pattern. The maximum intensity was given close to Ψ=0 deg. It has been made clear that the transition dipole moment at the time of photoexcitation at 355 nm is distributed centering on the centrifugal direction in the out-of-plane direction as well.

(4) Electroluminescence Spectrum

The following description concerns the technique of evaluating the light emission spectrum when current was injected to the organic electroluminescence device of the present invention, and light is emitted.

Basically, an evaluation was made using the measuring system of spatial distribution of photoexcitation light emission used in (3), by current injection this time, not by excitation by a laser beam. Teflon/Glass/ITO/PVC/PT/FB+PVA/LiF/Al and Glass/ITO/PVC/PT/FB+PVA/LiF/Al were used as samples. The difference of external emission intensity according to the presence or absence of Teflon of the top discharge layer was also evaluated. The injected voltage was fixed at 10 volts to evaluate the emission intensity at a wavelength of 420 nm, where the maximum value of light emission spectrum was given. For the actinometer sensor, the angle θ was changed in the Sx-Sz plane for measurement. The intensity of θ=0 deg. and θ were changed, and the angle at half the intensity when θ=0 deg. was assumed as a half power angle.

Table 1 shows the result of evaluation made in the above method. For both samples, there was an increase in the emission intensity with the increase in the degree of orientation. The half power angle was decreased with the increasing degree of orientation. Even when the degree of orientation was 0.6, the half power angle was 35°. In the sample with Teflon formed on the top discharge layer, the emission intensity was increased in all degrees of orientation over that of the sample where Teflon was not formed.

TABLE 1

| Configuration | Degree of orientation | Emission intensity (dc/m$^2$) | Half power angle (° C.) |
|---|---|---|---|
| Glass/ITO/PVC/PT/ FB + PVA/LiF/Al | 0 | 110 | 60 |
| | 0.1 | 120 | 57 |
| | 0.2 | 155 | 53 |
| | 0.3 | 182 | 51 |
| | 0.4 | 195 | 46 |
| | 0.5 | 210 | 40 |
| | 0.6 | 230 | 35 |

TABLE 1-continued

| Configuration | Degree of orientation | Emission intensity (dc/m$^2$) | Half power angle (° C.) |
|---|---|---|---|
| Teflon/Glass/ITO/PVC/ PT/FB + PVA/LiF/Al | 0 | 120 | 61 |
| | 0.1 | 130 | 58 |
| | 0.2 | 165 | 54 |
| | 0.3 | 195 | 50 |
| | 0.4 | 208 | 41 |
| | 0.5 | 222 | 40 |
| | 0.6 | 242 | 34 |

(Third Embodiment)

The following results of evaluating the characteristics of the organic electroluminescence device, based on another material configuration using the same technique as that of the Second Embodiment, were obtained.

In the preparation of orientation light emitting layer material FB+PVA used in the Second Embodiment, 3% Disperse Orange 13 (by Alrdich, Formal name; 4-[4-(phenylazo)-1-naphthylazo]phenol, abbreviated as DO13) of laser pigment was dispersed to obtain a solution (abbreviated as FB+PVA+DO13). An organic electroluminescence device was formed according to the same procedure as that of the Second Embodiment. As a result, electroluminescence was found to be widely distributed at a light emitting wavelength in the range of 500 to 700 nm. Furthermore, the electroluminescence was polarizing in the similar manner in the centrifugal direction, and the state of anisotropic orientation was formed. The sample (abbreviated as PVA+DO13) obtained by removing the FB from the light emitting material was prepared in a similar manner. An organic electroluminescence device was formed using a similar procedure, but light emission was not observed in the range of the voltage applied this time.

This makes it clear that electroluminescence emitted from the light emitting material FB was re-absorbed by the pigment DO13, and fluorescent light of longer wavelength was produced by the DO13.

Similarly, an orientation (FB+PVA) layer having half the film thickness of the Second Embodiment was formed on the light emitting layer. After that, an orientation (PVA+DO13) layer also having half the film thickness was formed, and electroluminescence with half intensity was observed. However, when the orientation (PVA+DO13) layer was formed under non-oriented conditions where it was formed at the central portion of the spin coater, the broad fluorescent light obtained was found to be polarized in the centrifugal direction of the (FB+PVA) layer.

(Fourth Embodiment)

The following description is directed to the means to widen the light emitting distribution of the organic electroluminescence device according to the present invention, and the result of studying the effect of the improvement in the angle of field based on said widening means.

In the organic electroluminescence device according to the present invention, as described in the First Embodiment 1, the amount of discharged light is increased if light is taken out when light emitting molecules are arrayed in the optimum direction for the wavelength being used. However, the discharge efficiency is improved in a specific direction, but the discharge efficiency in other directions is reduced. Especially when its use for display is considered, concerns arise over possible reduction in the angle of field characteristics.

The following description is directed to the face that the light discharge efficiency and field of view of the radiation angle can be improved by installation of an adequate intermediate layer between the top discharge layer and the light emitting layer.

Figure 15A:
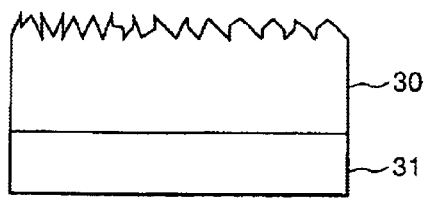
FIGS. 15(a) to 15(f) are diagrams showing examples of the second intermediate layer to improve the radiation angle of the organic electroluminescence device according to the present invention.

As discussed in the First Embodiment, the direction where the maximum emission intensity is provided at various orientation angles is the direction normal to the transition dipole moment. If this direction and the normal to the light discharge plane of the organic electroluminescence device are parallel to each other, it ensures the highest discharge efficiency. However, this means a reduced discharge efficiency in other directions; therefore, some means is preferred to be provided to widen the angle of field on the way. FIGS. 15(a) to 15(f) show examples of such means. The direction where the discharge efficiency is improved is the direction normal to the light discharge plane. FIGS. 15(a) to 15(f) show examples of a means of bending the ongoing direction of the light emitted in that direction. FIG. 15(a) shows the second intermediate layer (30) where a dispersion plane is provided on the plane opposite to the light emitting layer in order to bend the direction in which the light is emitted from the light emitting layer (31) upward. In this case, the direction of the light emitted in the normal direction is bent. At the same time, part of the dispersion plane, having a vertical incoming plane, is present for the light emitted in other than the normal direction. This leads to a reduction in containment of light by all reflections inside the device, and makes it possible to take out a greater amount of light. In this case, it is possible to provide a dispersion plane at the portion adjacent to the light emitting layer (31), but this requires the uneven spots to be provided on the plane of the light emitting layer. This makes it difficult to perform uniform electrical charge injection. At the same time, it becomes more likely to be affected by multiple reflection and others. Therefore, a distance of 10 times or more of the light wavelength is preferred to be provided between said dispersion plane and light emitting layer. To prevent reflection loss between the light emitting layer and the second intermediate layer in contact with the light emitting layer, there is preferred to be no difference of refractive index on the contact surface.

Figure 15D:
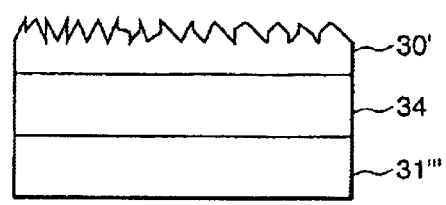
Figure 15B:
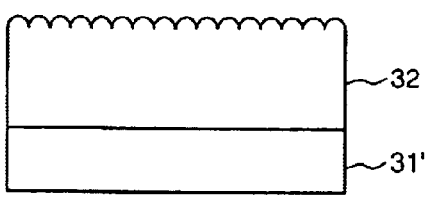

In FIG. 15(b), the second intermediate layer (32), equipped with a surface where a group of micro lens are installed, is provided on the surface opposite to the light emitting layer in order to bend the direction of the light emitted from the light emitting layer (31') upward. In this case, a distance of 10 times or more of the light wavelength is preferred to be provided between the micro lens plane and the light emitting layer. To prevent reflection loss between the light emitting layer and the second intermediate layer in contact with the light emitting layer, there is preferred to be no difference in refractive index on the contact surface.

Figure 15E:
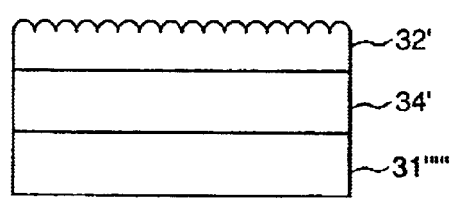
Figure 15C:
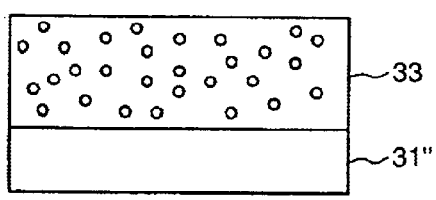

FIG. 15(c) shows the case where the second intermediate layer (33), provided with an internal scattering body, such as metallic fine particles and others, is provided on the surface opposite to the light emitting layer in order to bend the direction of the light emitted from the light emitting layer (31") upward. This is intended to widen the radiation angle by scattering. There is no restriction as to the thickness. To prevent reflection loss with the second intermediate layer in contact with the light emitting layer, there is preferred to be no difference in refractive index on the contact surface.

Figure 15F:
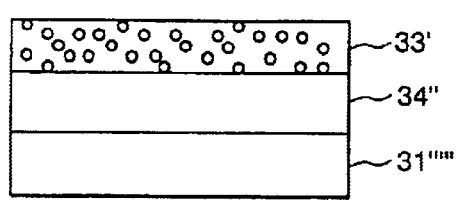

FIGS. 15(d), 15(e) and 15(f) correspond to FIGS. 15(a), 15(b) and 15(c), respectively. They show the configuration where simple second intermediate layers (34,34' and 34") are provided among each light emitting layer (31''', 31'''', and 31'''''), respectively. The second intermediate layer (30') is provided with a surface diffusion plane, the second intermediate layer (32') is provided with a microlens group surface, and the second intermediate layer (33') is provided with an internal light scattering body. There is preferred to be no difference in refractive index between the light emitting layer and the second intermediate layer to prevent reflection on the boundary. At the same time, absence of any difference in refractive index between the top light discharge plane of the device and the external air is essential to improve the discharge efficiency of the entire device. Thus, the reflection loss can be reduced by minimizing the refractive index of the functional second intermediate layer (30', 32' and 33') provided on the top layer and by introducing the simple type second intermediate layer which reduces the difference in refractive index with the light emitting layer. It is preferred to provide a layer having a refractive index intermediate between the two or a layer with a refractive index distribution which ensures gradual reduction of refractive index.

When such a light emitting layer is designed in a multiple fine pixel arrangement, as in the case of an image display device, the partition including the reflection surface with an oblique plane or curve, which ensures that light generated in the direction horizontal to the light discharge plane in the light emitting layer is bent in the vertical direction, can be used as the partition layer separating between adjacent light emitting layer pixels. This partition ensures further improvement of the discharge efficiency.

Use of the organic electroluminescence device according to the present invention provides a higher light discharge efficiency than the conventional organic electroluminescence device. At the same time, it provides characteristics of the optimum angle of field.

Furthermore, it makes it possible to obtain orientation conditions for the optimum light emitting molecules of the entire device. It also makes it possible to design an orientation means in conformity to the light emitting wavelength to be used, the direction, or the intermediate layer. It is possible to compensate for loss on the boundary with a layer other than the device internal light emitting layer, and to adjust changes in chromaticity. The obtained light emission produces polarized light in response to another light emitting material which provides secondary emission of light upon receipt of light from the light emitting material, in addition to one light emitting material; hence, polarized light corresponding to the full color can be emitted. These characteristics provide high functions as an image display device, including a 3-D color display, based on a high contrast display without the need of polarizing plate, and the state of polarization. At the same time, they provides a flat type optical information processor for a new light exchanger and an optical arithmetic unit.

The present invention provides an organic electroluminescence device characterized by an excellent discharge efficiency, and photoelectron device using said electroluminescence device.

What is claimed:

1. An organic electroluminescence device, comprising:
   a surface layer;
   a transparent substrate formed on the surface layer;
   a transparent electrode formed on the transparent substrate;
   a light emitting layer, formed on the transparent electrode, the light emitting layer enabling injection of positive and negative electrical charges therein; and
   an opposing electrode formed with respect to the light emitting layer so that the light emitting layer is arranged between the transparent electrode and the opposing electrode;
   wherein the light emitting layer contains a light emitting substance for emitting light anisotropically, the light emitting substance having transition dipole moments attributable to a molecular skeleton thereof, and the transition dipole moments being oriented within an angular range from 0 degree to 70 degrees with respect to a direction normal to a surface layer side surface of the light emitting layer.

2. An electroluminescence device according to claim 1, wherein light emitted by the light emitting layer is polarized light.

3. An electroluminescence device according to claim 1, further comprising an intermediate layer which is formed between the light emitting layer and the surface layer, the intermediate layer having a refractive index of not greater than 1.42.

4. An electroluminescence device according to claim 1, further comprising an intermediate layer which is formed between the light emitting layer and the surface layer and which is lower in refractive index than a refractive index of the light emitting layer.

5. An organic electroluminescence device according to claim 3, wherein the intermediate layer has a thickness greater than a maximum wavelength of light emitted by the light emitting layer.

6. An organic electroluminescence device according to claim 4, wherein the intermediate layer has a thickness greater than a maximum wavelength of light emitted by the light emitting layer.

7. An electroluminescence device according to claim 1, wherein light emitted by the light emitting layer has a maximum intensity within an angular range from 0 degree to 60 degrees with respect to the direction normal to the surface layer side surface of the light emitting layer.

8. An electroluminescence device according to claim 1, wherein the light emitting layer further contains a fluorescent substance emitting secondary light upon receipt of light from the light emitting substance.

9. An electroluminescence device according to claim 1, wherein an intensity of light emitted by the light emitting layer at an angle of at least 40 degrees with respect to the direction normal to a surface of the light emitting layer on the opposite side to the surface layer is one half of an intensity of light emitted by the light emitting layer in the direction normal to the surface of the light emitting layer on the opposite side to the surface layer.

10. An electroluminescence device according to claim 1, wherein the light emitting layer further contains an organic compound of ionicity.

11. An electroluminescence device according to claim 1, wherein the light emitting substance comprises an organic compound having the following structural formula:

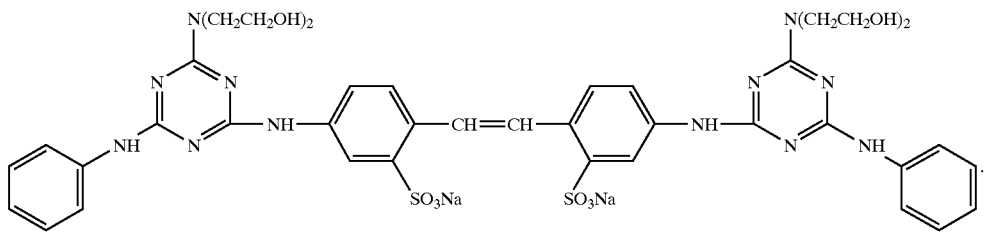

12. A photoelectron device using an electroluminescence device, wherein the electroluminescence device comprises:
   a surface layer;
   a transparent substrate formed on the surface layer;
   a transparent electrode formed on the transparent substrate;
   a light emitting layer, formed on the transparent electrode, the light emitting layer enabling injection of positive and negative electrical charges therein; and
   an opposing electrode formed with respect to the light emitting layer so that the light emitting layer is arranged between the transparent electrode and the opposing electrode;
   wherein the light emitting layer contains a light emitting substance for emitting light anisotropically, the light emitting substance having transition dipole moments attributable to a molecular skeleton thereof, and the transition dipole moments being oriented within an angular range from 0 degree to 70 degrees with respect to a direction normal to a surface layer side surface of the light emitting layer.

* * * * *